US009508561B2

(12) United States Patent
Naik et al.

(10) Patent No.: US 9,508,561 B2
(45) Date of Patent: Nov. 29, 2016

(54) METHODS FOR FORMING INTERCONNECTION STRUCTURES IN AN INTEGRATED CLUSTER SYSTEM FOR SEMICONDCUTOR APPLICATIONS

(71) Applicant: Applied Materials, Inc., Santa Clara, CA (US)

(72) Inventors: Mehul B. Naik, San Jose, CA (US); Srinivas D. Nemani, Sunnyvale, CA (US); Takehito Koshizawa, San Jose, CA (US); He Ren, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 108 days.

(21) Appl. No.: 14/276,879

(22) Filed: May 13, 2014

(65) Prior Publication Data

US 2015/0262869 A1    Sep. 17, 2015

Related U.S. Application Data

(60) Provisional application No. 61/951,386, filed on Mar. 11, 2014.

(51) Int. Cl.
*H01L 21/02* (2006.01)
*H01L 21/768* (2006.01)
*H01L 21/3213* (2006.01)
*H01L 21/67* (2006.01)
*H01J 37/32* (2006.01)

(52) U.S. Cl.
CPC ....... *H01L 21/32136* (2013.01); *H01J 37/321* (2013.01); *H01J 37/3244* (2013.01); *H01J 37/32357* (2013.01); *H01L 21/02071* (2013.01); *H01L 21/02274* (2013.01); *H01L 21/32139* (2013.01); *H01L 21/67184* (2013.01); *H01L 21/67207* (2013.01); *H01L 21/7685* (2013.01); *H01L 21/76834* (2013.01); *H01L 21/76885* (2013.01)

(58) Field of Classification Search
None
See application file for complete search history.

(56) References Cited

U.S. PATENT DOCUMENTS

| | | | |
|---|---|---|---|
| 6,010,966 | A | 1/2000 | Ionov |
| 6,080,529 | A | 6/2000 | Ye et al. |
| 6,207,487 | B1 | 3/2001 | Kim et al. |
| 6,242,808 | B1 | 6/2001 | Shimizu et al. |

(Continued)

FOREIGN PATENT DOCUMENTS

WO    WO-2007126461 A2    11/2007

OTHER PUBLICATIONS

PCT Search Report and Written Opinion for PCT/US2015/014096, dated May 29, 2015, 13 pgs.

*Primary Examiner* — Shamim Ahmed
(74) *Attorney, Agent, or Firm* — Patterson & Sheridan, LLP

(57) ABSTRACT

Embodiments of the present invention provide methods for forming an interconnection structure in semiconductor devices without breaking vacuum with minimum oxidation/atmosphere exposure. In one embodiment, a method for forming an interconnection structure for semiconductor devices includes supplying a barrier layer etching gas mixture into a first processing chamber having a substrate disposed therein to etch portions of a barrier layer exposed by a patterned metal layer until the underlying substrate is exposed, the first processing chamber disposed in a processing system, and forming a liner layer on the substrate covering the etched barrier layer in a second processing chamber disposed in the processing system.

20 Claims, 8 Drawing Sheets

(56) References Cited

U.S. PATENT DOCUMENTS

| | | |
|---|---|---|
| 6,251,242 B1 | 6/2001 | Fu et al. |
| 6,277,249 B1 | 8/2001 | Gopalraja et al. |
| 6,277,745 B1 | 8/2001 | Liu et al. |
| 6,284,646 B1 | 9/2001 | Leem |
| 6,305,314 B1 | 10/2001 | Sneh et al. |
| 6,335,240 B1 | 1/2002 | Kim et al. |
| 6,344,419 B1 | 2/2002 | Forster et al. |
| 6,348,376 B2 | 2/2002 | Lim et al. |
| 6,358,829 B2 | 3/2002 | Yoon et al. |
| 6,372,598 B2 | 4/2002 | Kang et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 7,005,372 B2 | 2/2006 | Levy et al. |
| 7,691,749 B2 | 4/2010 | Levy et al. |
| 2003/0059538 A1 | 3/2003 | Chung et al. |
| 2005/0017361 A1* | 1/2005 | Lin ............... H01L 23/5222 257/756 |
| 2005/0230350 A1 | 10/2005 | Kao et al. |
| 2006/0051966 A1 | 3/2006 | Or et al. |
| 2006/0178007 A1* | 8/2006 | Nakamura ........ H01L 21/76843 438/675 |
| 2006/0286776 A1 | 12/2006 | Ranish et al. |
| 2007/0015360 A1 | 1/2007 | Lu et al. |
| 2007/0123051 A1 | 5/2007 | Arghavani et al. |
| 2007/0209931 A1 | 9/2007 | Miller |
| 2008/0160210 A1 | 7/2008 | Yang et al. |
| 2008/0268645 A1 | 10/2008 | Kao et al. |
| 2009/0014877 A1* | 1/2009 | Chang ............... H01L 21/76834 257/751 |
| 2009/0311859 A1* | 12/2009 | Bonilla ............. H01L 21/02074 438/637 |
| 2010/0018460 A1 | 1/2010 | Singh et al. |
| 2010/0075494 A1 | 3/2010 | Chung et al. |
| 2010/0090346 A1* | 4/2010 | Torres ................ H01L 21/7682 257/773 |
| 2010/0200993 A1 | 8/2010 | Cui et al. |
| 2011/0006429 A1* | 1/2011 | Liu ................... H01L 21/76831 257/751 |
| 2014/0099734 A1* | 4/2014 | Saito ................ H01L 21/0226 438/3 |
| 2015/0214101 A1* | 7/2015 | Ren .................... H01L 21/3065 438/704 |

* cited by examiner

TO FIG. 8A-8C

METHODS FOR FORMING INTERCONNECTION STRUCTURES IN AN INTEGRATED CLUSTER SYSTEM FOR SEMICONDCUTOR APPLICATIONS

This application claims benefit of U.S. Provisional Patent Application Ser. No. 61/951,386, filed Mar. 11, 2014, which is incorporated by reference in its entirety.

BACKGROUND

Field

Embodiments of the present invention generally relate to methods of patterning a metal layer, and more particularly to methods of forming an interconnection structure in an integrated cluster system without breaking vacuum in semiconductor applications.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials (e.g., copper) as well as low dielectric constant insulating materials (dielectric constant less than about 4) to obtain suitable electrical performance from such components.

The demands for greater integrated circuit densities also impose demands on the process sequences used in the manufacture of integrated circuit components. As the geometry limits of the structures used to form semiconductor devices are pushed against technology limits, the need for accurate pattern transfer for the manufacture of structures have small critical dimensions and high aspect ratios has become increasingly difficult. For an interconnection structure, copper is particularly advantageous for use in metal structures due to its desirable electrical properties. Copper interconnects are electrically isolated from each other by an insulating material. When the distance between adjacent metal interconnects and/or thickness of the insulating material has sub-micron dimensions, capacitive coupling may potentially occur between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e.g. dielectric constants less than about 4.0) are needed.

Copper interconnect system are typically fabricated using a damascene process in which trenches and vias are etched into dielectric layers. The trenches and vias are filled with copper which is then planarized using, for example, a chemical-mechanical planarization (CMP) process. However, several disadvantages associated with copper damascene structure have become severe concerns as feature sizes continue to decrease. For example, small feature size of the metal lines generally requires higher aspect ratio, which may adversely increase difficulty to fill such features to form void free metal structures. Forming a barrier layer within high aspect features is particularly difficult. Furthermore, as feature sizes continue to decrease, the barrier layer cannot scale, thus resulting the barrier layer in greater fraction of that particular feature. Additionally, as the feature dimensions become comparable to the bulk mean free path, the effective resistivity of copper features will increase because of non-negligible electron scattering at the copper-barrier interface and at grain boundaries.

Accordingly, an alternate metal patterning using subtractive metal etching (SME) process has recently gained wide attention. A dry plasma etching process is performed to pattern the metal materials to form one or more patterns in the interconnect structure. However, after the metal etching process, the metal interconnection is often exposed to air. Excess exposure of the metal conductive materials to air may adversely affect the nucleation capability of the metal elements to adhere to the substrate surface during a subsequently metallization process. Furthermore, poor adhesion at the interface may also result in undesired high contact resistance, thereby resulting in undesirably poor electrical properties of the device. In addition, poor nucleation of the metal elements in the back end interconnection may impact not only the electrical performance of the devices, but also on the integration of the conductive contact material subsequently formed thereon.

Recently, a metal containing passivation layer is utilized to cover the exposed surface of a metal line formed in interconnects from the dielectric bulk insulating materials. The metal containing passivation layer may minimize exposure of the metal line from the interconnect material to atmosphere/air so as to prevent damage to the semiconductor device. By utilizing this metal containing passivation layer formed on the metal line, exposure to the air/atmosphere may be minimized. However, in some cases, inadequate control of the Q-times in the processes of forming and patterning each layer, including the metal layer and passivation protection, may adversely result in excess oxidation formed onto the metal surface, thereby in high contact resistance and poor adhesion. Overly long exposure time of each layer in the interconnection structure to air or ambient may also undesirably create contamination sources or oxidation growth at the interface, resulting in film degradation and eventually leading to device failure.

Thus, there is a need for improved methods for forming an interconnection structure with improved process control without excess oxidation exposure to form accurate and desired interconnection structure for semiconductor devices.

SUMMARY

Embodiments of the present invention provide methods for forming an interconnection structure in semiconductor devices without breaking vacuum with minimum oxidation/atmosphere exposure. In one embodiment, a method for forming an interconnection structure for semiconductor devices includes supplying a barrier layer etching gas mixture into a first processing chamber having a substrate disposed therein to etch portions of a barrier layer exposed by a patterned metal layer until the underlying substrate is exposed, the first processing chamber disposed in a processing system, and forming a liner layer on the substrate covering the etched barrier layer in a second processing chamber disposed in the processing system.

In another embodiment, a method for forming an interconnection structure for semiconductor devices includes performing a metal etching process on a substrate in a first processing chamber disposed in a processing system to etch a metal layer disposed on a substrate, wherein the substrate has the metal layer disposed on a barrier layer, a patterned hardmask layer disposed on the metal layer exposing portions of the metal layer for etching, performing a barrier layer etching process in a second processing chamber disposed in the processing system to etch the barrier layer exposed by the metal layer after the metal etching process, and performing a liner layer deposition process in a third processing chamber disposed in the plasma processing chamber on the substrate to form a liner layer on the substrate.

In yet another embodiment, a method for forming an interconnection structure for semiconductor devices includes performing a metal etching process on a substrate to etch a metal layer disposed on a substrate, wherein the substrate has the metal layer disposed on a barrier layer, a patterned hardmask layer disposed on the metal layer exposing portions of the metal layer for etching, performing a barrier layer etching process to etch the barrier layer exposed by the metal layer after the metal etching process, and performing a liner layer deposition process on the substrate to form a liner layer on the substrate, wherein the metal etching process, barrier layer etching process and the liner layer deposition process are formed in a processing system without breaking vacuum.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods for forming an interconnection structure in semiconductor devices without breaking vacuum with minimum oxidation/atmosphere exposure. In one embodiment, the interconnection structure may be formed by utilizing a dry etching process to etch a metal layer and a barrier layer, and subsequently forming liner layer on the substrate without breaking vacuum. The processes for forming the interconnection structure may be all integrated and performed in a processing system, i.e., a cluster system, to deposit, form and pattern layers in a single processing system without breaking vacuum so as to reduce the likelihood of surface oxidation, contamination, thereby providing a good control of profile formation and electrical properties for semiconductor devices.

Figure 1:
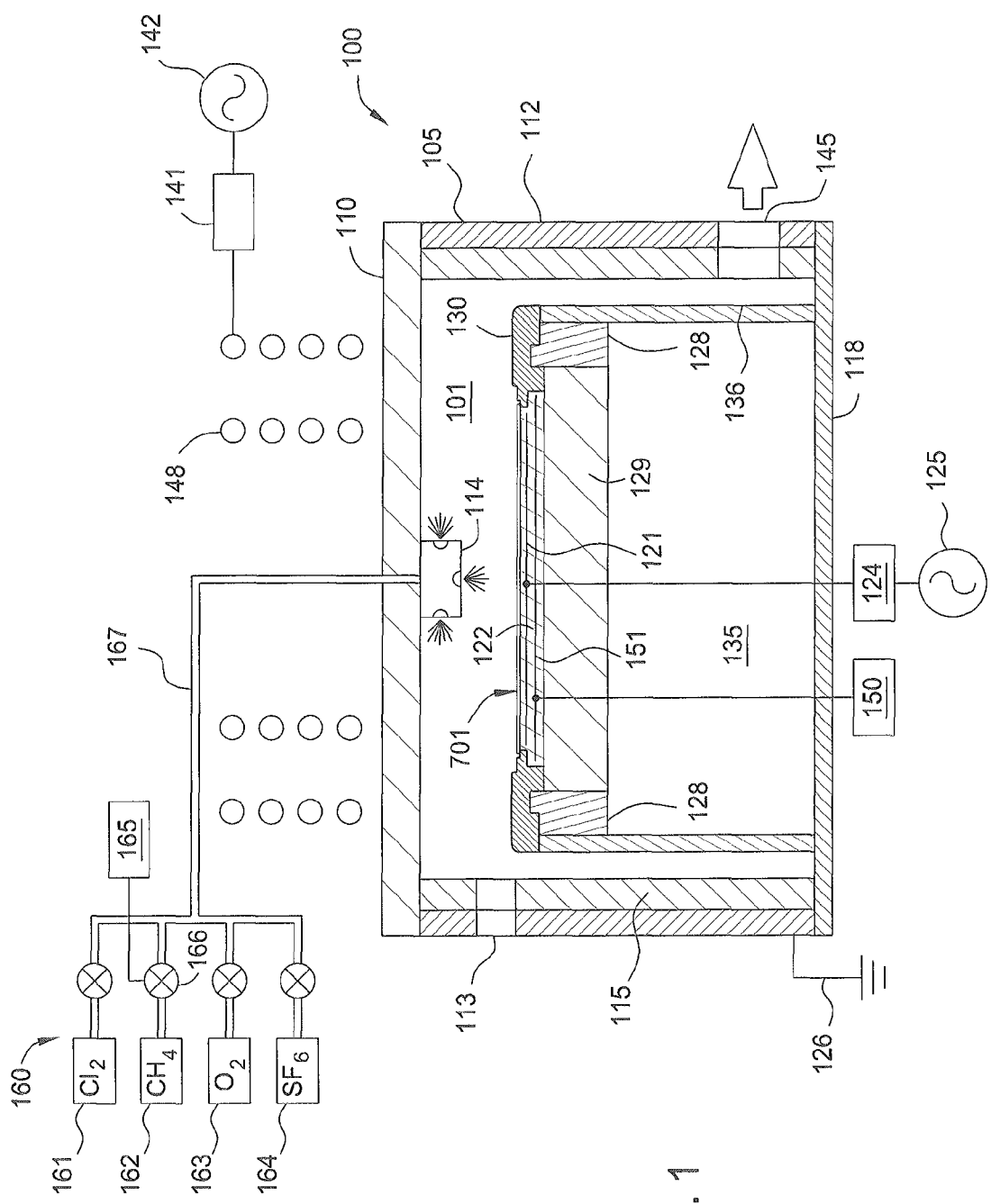
FIG. 1 depicts an apparatus utilized to pattern a metal layer formed on a substrate to manufacture an interconnection structure in accordance with one embodiment of the present invention.

FIG. 1 is a simplified cutaway view for an exemplary etch processing chamber 100 for etching a metal layer. The exemplary etch processing chamber 100 is suitable for removing one or more film layers from the substrate 701. One example of the process chamber that may be adapted to benefit from the invention is an AdvantEdge Mesa Etch processing chamber, available from Applied Materials, Inc., located in Santa Clara, Calif. It is contemplated that other process chambers, including those from other manufactures, may be adapted to practice embodiments of the invention.

The etch processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the etch processing chamber 100. The dimensions of the chamber body 105 and related components of the etch processing chamber 100 are not limited and generally are proportionally larger than the size of the substrate 701 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 701 into and out of the etch processing chamber 100. The access port 113 may be coupled to a transfer chamber and/or other chambers of a substrate processing system (not shown).

A pumping port 145 is formed through the sidewall 112 of the chamber body 305 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine (Cl$_2$), nitrogen (N2), and oxygen gas (O$_2$). Additionally, process gasses may include chlorine, fluorine, oxygen and hydrogen containing gases such as BCl$_3$, C$_4$F$_8$, C$_4$F$_6$, CHF$_3$, CH$_2$F$_2$, CH$_3$F, NF$_3$, CO$_2$, SO$_2$, CO, and H$_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the etch processing chamber 100, the gases are energized to form plasma. An antenna 148, such as one or more inductor coils, may be provided adjacent to the etch processing chamber 100. An antenna power supply 142 may power the antenna 148 through a match circuit 141 to inductively couple energy, such as RF energy, to the process gas to maintain a plasma formed from the process gas in the chamber volume 101 of the etch processing chamber 100. Alternatively, or in addition to the antenna power supply 142, process electrodes below the substrate 701 and/or above the substrate 701 may be used to capacitively couple RF power to the process gases to maintain the plasma within the chamber volume 101. The operation of the power supply 142 may be controlled by a controller, such as controller 165, that also controls the operation of other components in the etch processing chamber 100.

A substrate support pedestal 135 is disposed in the chamber volume 101 to support the substrate 701 during processing. The support pedestal 135 may include an electro-static chuck 122 for holding the substrate 701 during processing. The electro-static chuck (ESC) 122 uses the electro-static attraction to hold the substrate 701 to the substrate support pedestal 135. The ESC 122 is powered by an RF power supply 125 integrated with a match circuit 124. The ESC 122 comprises an electrode 121 embedded within a dielectric body. The RF power supply 125 may provide a RF chucking voltage of about 200 volts to about 2000 volts to the electrode 121. The RF power supply 125 may also include a system controller for controlling the operation of the electrode 121 by directing a DC current to the electrode 121 for chucking and de-chucking the substrate 701.

The ESC 122 may also include an electrode 151 deposed therein. The electrode 151 is coupled to a power source 150 and provides a bias which attracts plasma ions, formed by the process gases in the chamber volume 101, to the ESC 122 and substrate 701 positioned thereon. The power source 150 may cycle on and off, or pulse, during processing of the substrate 701. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma etch processing chamber 100.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 701 disposed thereon. The ESC 122 is configured to perform in the temperature range required by the thermal budget of the device being fabricated on the substrate 701. For example, the ESC 122 may be configured to maintain the substrate 701 at a temperature of about minus about 25 degrees Celsius to about 500 degrees Celsius for certain embodiments.

The cooling base 129 is provided to assist in controlling the temperature of the substrate 701. To mitigate process drift and time, the temperature of the substrate 701 may be maintained substantially constant by the cooling base 129 throughout the time the substrate 701 is in the etch chamber. In one embodiment, the temperature of the substrate 701 is maintained throughout subsequent etch processes at about 70 to 90 degrees Celsius.

A cover ring 130 is disposed on the ESC 122 and along the periphery of the substrate support pedestal 135. The cover ring 130 is configured to confine etching gases to a desired portion of the exposed top surface of the substrate 701, while shielding the top surface of the substrate support pedestal 135 from the plasma environment inside the etch processing chamber 100. Lift pins (not shown) are selectively moved through the substrate support pedestal 135 to lift the substrate 701 above the substrate support pedestal 135 to facilitate access to the substrate 701 by a transfer robot (not shown) or other suitable transfer mechanism.

The controller 165 may be utilized to control the process sequence, regulating the gas flows from the gas panel 160 into the etch processing chamber 100 and other process parameters. Software routines, when executed by the CPU, transform the CPU into a specific purpose computer (controller) that controls the etch processing chamber 100 such that the processes are performed in accordance with the present invention. The software routines may also be stored and/or executed by a second controller (not shown) that is collocated with the etch processing chamber 100.

The substrate 701 has various film layers disposed thereon which may include at least one metal layer. The various film layers may require etch recipes which are unique for the different compositions of the other film layers in the substrate 701. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, etch processing chamber 100 is configured to at least etch a metal layer to form an interconnection structure. For processing parameters provided herein, the etch processing chamber 100 is configured to process a 300 diameter substrate, i.e., a substrate having a plan area of about 0.0707 m$^2$. The process parameters, such as flow and power, may generally be scaled proportionally with the change in the chamber volume or substrate plan area.

Figure 2:
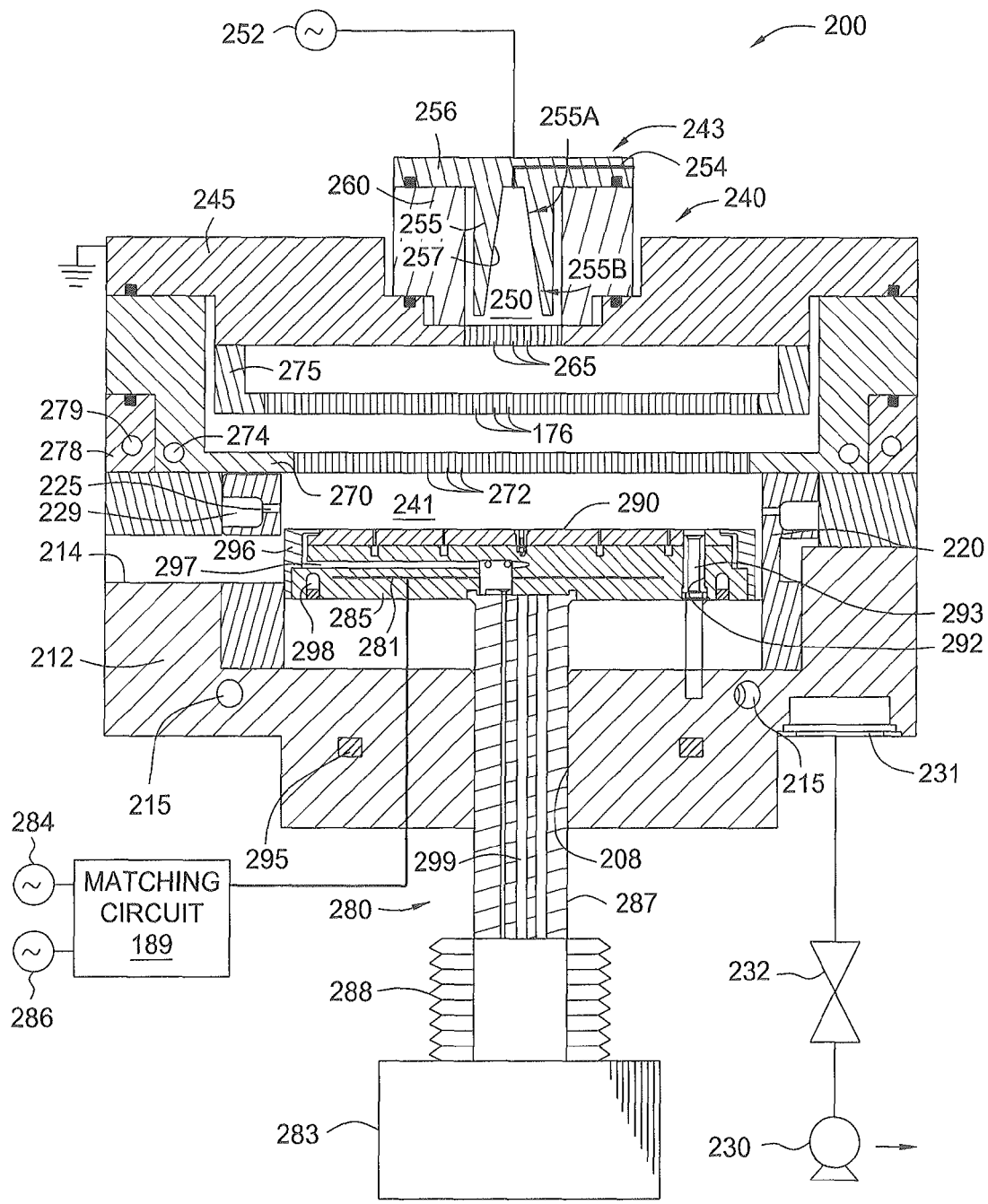
FIG. 2 depicts a schematic cross-sectional view of one embodiment of a process chamber utilized to etch a barrier layer in accordance with the invention.

FIG. 2 is a cross sectional view of an illustrative processing chamber 200 suitable for conducting an etching process, such as a barrier etching process, as further described below. The chamber 200 is configured to remove materials from a material layer disposed on a substrate surface. The chamber 200 is particularly useful for performing the plasma assisted dry etch process. One processing chamber 200 suitable for practicing the invention is a Siconi™ processing chamber which is available from Applied Materials, Santa Clara, Calif. It is noted that other vacuum processing chambers available from other manufactures may also be adapted to practice the present invention.

The processing chamber 200 provides both heating and cooling of a substrate surface without breaking vacuum. In one embodiment, the processing chamber 200 includes a chamber body 212, a lid assembly 240, and a support assembly 280. The lid assembly 240 is disposed at an upper end of the chamber body 212, and the support assembly 280 is at least partially disposed within the chamber body 212.

The chamber body 212 includes a slit valve opening 214 formed in a sidewall thereof to provide access to an interior of the processing chamber 200. The slit valve opening 214 is selectively opened and closed to allow access to the interior of the chamber body 212 by a wafer handling robot (not shown).

In one or more embodiments, the chamber body 212 includes a channel 215 formed therein for flowing a heat transfer fluid therethrough. The heat transfer fluid can be a heating fluid or a coolant and is used to control the temperature of the chamber body 212 during processing. Control of the temperature of the chamber body 212 is important to prevent unwanted condensation of the gas or byproducts on the interior of the chamber body 212. Exemplary heat transfer fluids include water, ethylene glycol, or a mixture thereof. An exemplary heat transfer fluid may also include nitrogen gas.

The chamber body 212 can further include a liner 220 that surrounds the support assembly 280. The liner 220 is removable for servicing and cleaning. The liner 220 can be made of a metal such as aluminum, a ceramic material, or any other process compatible material. The liner 220 can be bead blasted to increase surface roughness and/or surface area which increases the adhesion of any material deposited thereon, thereby preventing flaking of material which results in contamination of the processing chamber 200. In one or more embodiments, the liner 220 includes one or more apertures 225 and a pumping channel 229 formed therein that is in fluid communication with a vacuum port 231. The apertures 225 provide a flow path for gases into the pumping channel 229, which provides an egress for the gases within the processing chamber 200 to the vacuum port 231.

A vacuum system is coupled to the vacuum port 231. The vacuum system may include a vacuum pump 230 and a throttle valve 232 to regulate flow of gases through the processing chamber 200. The vacuum pump 230 is coupled to a vacuum port 231 disposed in the chamber body 212 and therefore, in fluid communication with the pumping channel 229 formed within the liner 220. The terms "gas" and "gases" are used interchangeably, unless otherwise noted, and refer to one or more precursors, reactants, catalysts, carrier, purge, cleaning, combinations thereof, as well as any other fluid introduced into the chamber body 212.

The lid assembly 240 includes at least two stacked components configured to form a plasma volume or cavity therebetween. In one or more embodiments, the lid assembly 240 includes a first electrode 243 ("upper electrode") disposed vertically above a second electrode 245 ("lower electrode") confining a plasma volume or cavity 250 therebetween. The first electrode 243 is connected to a power source 252, such as an RF power supply, and the second electrode 245 is connected to ground, forming a capacitance between the two electrodes 243,245.

In one or more embodiments, the lid assembly 240 includes one or more gas inlets 254 (only one is shown) that are at least partially formed within an upper section 256 of the first electrode 243. The one or more process gases enter the lid assembly 240 via the one or more gas inlets 254. The one or more gas inlets 254 are in fluid communication with the plasma cavity 250 at a first end thereof and coupled to one or more upstream gas sources and/or other gas delivery components, such as gas mixers, at a second end thereof.

In one or more embodiments, the first electrode 243 has an expanding section 255 that bounds the plasma cavity 250. In one or more embodiments, the expanding section 255 is an annular member that has an inner surface or diameter 257 that gradually increases from an upper portion 255A thereof to a lower portion 255B thereof. As such, the distance between the first electrode 243 and the second electrode 245 is variable across the expanding section 255. The varying distance helps control the formation and stability of the plasma generated within the plasma cavity 250.

In one or more embodiments, the expanding section 255 resembles an inverted truncated cone or "funnel." In one or more embodiments, the inner surface 157 of the expanding section 255 gradually slopes from the upper portion 255A to the lower portion 255B of the expanding section 255. The slope or angle of the inner diameter 257 can vary depending on process requirements and/or process limitations. The length or height of the expanding section 255 can also vary depending on specific process requirements and/or limitations.

As mentioned above, the expanding section 255 of the first electrode 243 varies the vertical distance between the first electrode 243 and the second electrode 245 because of the gradually increasing inner surface 257 of the first electrode 243. The variable distance is directly influences to the power level within the plasma cavity 250. Not wishing to be bound by theory, the variation in distance between the two electrodes 243, 245 allows the plasma to find the necessary power level to sustain itself within some portion of the plasma cavity 250 if not throughout the entire plasma cavity 250. The plasma within the plasma cavity 250 is therefore less dependent on pressure, allowing the plasma to be generated and sustained within a wider operating window. As such, a more repeatable and reliable plasma can be formed within the lid assembly 240. As the plasma generated in the plasma cavity 250 is defined in the lid assembly 240 prior to entering into a processing region 241 above the support assembly 180 wherein the substrate is proceed, the lid assembly 240 is considered as a remote plasma source because the plasma generated remotely from the processing region 241.

The expanding section 255 is in fluid communication with the gas inlet 254 as described above. The first end of the one or more gas inlets 254 can open into the plasma cavity 250 at the upper most point of the inner diameter of the expanding section 255. Similarly, the first end of the one or more gas inlets 254 can open into the plasma cavity 250 at any height interval along the inner diameter 257 of the expanding section 255. Although not shown, two gas inlets 254 can be disposed at opposite sides of the expanding section 255 to create a swirling flow pattern or "vortex" flow into the expanding section 255 which helps mix the gases within the plasma cavity 250.

The lid assembly 240 can further include an isolator ring 260 that electrically isolates the first electrode 243 from the second electrode 245. The isolator ring 260 can be made from aluminum oxide or any other insulative, process compatible material. The isolator ring 260 surrounds or substantially surrounds at least the expanding section 255.

The lid assembly 240 can further include a distribution plate 270 and blocker plate 275 adjacent the second electrode 245. The second electrode 245, distribution plate 270 and blacker plate 275 can be stacked and disposed on a lid rim 278 which is connected to the chamber body 212. A hinge assembly (not shown) can be used to couple the lid rim 278 to the chamber body 212. The lid rim 278 can include an embedded channel or passage 279 for circulating a heat transfer medium. The heat transfer medium can be used for heating, cooling, or both, depending on the process requirements.

In one or more embodiments, the second electrode or top plate 245 can include a plurality of gas passages or apertures 265 formed beneath the plasma cavity 250 to allow gas from the plasma cavity 250 to flow therethrough. The distribution plate 270 is substantially disc-shaped and also includes a plurality of apertures 272 or passageways to distribute the flow of gases therethrough. The apertures 272 can be sized and positioned about the distribution plate 270 to provide a controlled and even flow distribution to the processing region 241 of the chamber body 212 where the substrate to be processed is located. Furthermore, the apertures 272 prevent the gas(es) from impinging directly on the substrate surface by slowing and re-directing the velocity profile of the flowing gases, as well as evenly distributing the flow of gas to provide an even distribution of gas across the surface of the substrate.

In one or more embodiments, the distribution plate 270 includes one or more embedded channels or passages 274 for housing a heater or heating fluid to provide temperature control of the lid assembly 240. A resistive heating element (not shown) can be inserted within the passage 274 to heat the distribution plate 270. A thermocouple can be connected to the distribution plate 270 to regulate the temperature thereof. The thermocouple can be used in a feedback loop to control electric current applied to the heating element, as described above.

Alternatively, a heat transfer medium can be passed through the passage 274. The one or more passages 274 can contain a cooling medium, if needed, to better control temperature of the distribution plate 270 depending on the process requirements within the chamber body 212. Any heat suitable transfer medium may be used, such as nitrogen, water, ethylene glycol, or mixtures thereof, for example.

In one or more embodiments, the lid assembly 240 can be heated using one or more heat lamps (not shown). Typically, the heat lamps are arranged about an upper surface of the distribution plate 270 to heat the components of the lid assembly 240 including the distribution plate 270 by radiation.

The blocker plate 275 may optionally be disposed between the second electrode 245 and the distribution plate 270. The blocker plate 275 is removably mounted to a lower surface of the second electrode 245. The blocker plate 275 may be in good thermal and electrical contact with the second electrode 245. In one or more embodiments, the blocker plate 275 can be coupled to the second electrode 245 using a bolt or similar fastener. The blocker plate 275 can also be threaded or screwed onto an outer diameter of the second electrode 245.

The blocker plate 275 includes a plurality of apertures 276 to provide a plurality of gas passages from the second electrode 245 to the distribution plate 270. The apertures 276 can be sized and positioned about the blocker plate 275 to provide a controlled and even flow distribution of gases to the distribution plate 270.

The support assembly 280 can include a support member 285 to support a substrate (not shown in FIG. 2) for processing within the chamber body 212. The support member 285 can be coupled to a lift mechanism 283 through a shaft 287 which extends through a centrally-located opening 208 formed in a bottom surface of the chamber body 212. The lift mechanism 283 can be flexibly sealed to the chamber body 212 by a bellows 288 that prevents vacuum leakage from around the shaft 287. The lift mechanism 283 allows the support member 285 to be moved vertically within the chamber body 212 between a process position and a lower transfer position. The transfer position is slightly below the slit valve opening 214 formed in a sidewall of the chamber body 212 so that the substrate may be robotically removed from the substrate support member 285.

In one or more embodiments, the support member 285 has a flat, circular surface or a substantially flat, circular surface for supporting a substrate to be processed thereon. The support member 285 may be constructed of aluminum. The support member 285 can include a removable top plate 290 made of some other material, such as silicon or ceramic material, for example, to reduce backside contamination of the substrate.

In one or more embodiments, the substrate (not shown) may be secured to the support member 285 using a vacuum chuck. In one or more embodiments, the substrate (not shown) may be secured to the support member 285 using an electrostatic chuck. An electrostatic chuck typically includes at least a dielectric material that surrounds an electrode 281, which may be located on the support member 285 or formed as an integral part of the support member 285. The dielectric portion of the chuck electrically insulates the chuck electrode 281 from the substrate and from the remainder of the support assembly 280.

In one embodiment, the electrode 281 is coupled to a plurality of RF power bias sources 284, 286. The RF bias power sources 284, 286 provide RF power to the electrode 281, which excites and sustains a plasma discharge formed from the gases disposed in the processing region 241 of the chamber body 212.

In the embodiment depicted in FIG. 2, the dual RF bias power sources 284, 286 are coupled to the electrode 281 disposed in the support member 285 through a matching circuit 289. The signal generated by the RF bias power sources 284, 286 is delivered through matching circuit 289 to the support member 285 through a single feed to ionize the gas mixture provided in the plasma processing chamber 200, thereby providing ion energy necessary for performing a deposition, etch, or other plasma enhanced process. The RF bias power sources 284, 286 are generally capable of producing an RF signal having a frequency of from about 50 kHz to about 200 MHz and a power between about 0 Watts and about 5000 Watts. Additional bias power sources may be coupled to the electrode 281 to control the characteristics of the plasma as needed.

The support member 285 can include bores 292 formed therethrough to accommodate lift pins 293, one of which is shown in FIG. 2. Each lift pin 293 is constructed of ceramic or ceramic-containing materials, and are used for substrate-handling and transport. The lift pin 293 is moveable within its respective bore 292 when engaging an annular lift ring 295 disposed within the chamber body 212. The lift ring 195 is movable such that the upper surface of the lift pin 293 can be extended above the substrate support surface of the support member 285 when the lift ring 295 is in an upper position. Conversely, the upper surface of the lift pins 293 is located below the substrate support surface of the support member 285 when the lift ring 295 is in a lower position. Thus, each lift pin 293 is moved in its respective bore 292 in the support member 285 when the lift ring 295 moves between the lower position and the upper position.

The support assembly 280 can further include an edge ring 296 disposed about the support member 285. In one or more embodiments, the edge ring 296 is an annular member that is adapted to cover an outer perimeter of the support member 185 and protect the support member 285 from deposition. The edge ring 296 can be positioned on or adjacent the support member 285 to form an annular purge gas channel between the outer diameter of support member 285 and the inner diameter of the edge ring 296. The annular purge gas channel can be in fluid communication with a purge gas conduit 297 formed through the support member 285 and the shaft 287. The purge gas conduit 297 is in fluid communication with a purge gas supply (not shown) to provide a purge gas to the purge gas channel. Any suitable purge gas such as nitrogen, argon, or helium, may be used alone or in combination. In operation, the purge gas flows through the conduit 297, into the purge gas channel, and about an edge of the substrate disposed on the support member 285. Accordingly, the purge gas working in cooperation with the edge ring 296 prevents deposition at the edge and/or backside of the substrate.

The temperature of the support assembly 280 can be controlled by a fluid circulated through a fluid channel 298 embedded in the body of the support member 285. In one or more embodiments, the fluid channel 298 is in fluid communication with a heat transfer conduit 299 disposed through the shaft 287 of the support assembly 280. The fluid channel 298 is positioned about the support member 285 to provide a uniform heat transfer to the substrate receiving surface of the support member 285. The fluid channel 298 and heat transfer conduit 299 can flow heat transfer fluids to either heat or cool the support member 285 and substrate disposed thereon. Any suitable heat transfer fluid may be used, such as water, nitrogen, ethylene glycol, or mixtures thereof. The support member 285 can further include an embedded thermocouple (not shown) for monitoring the temperature of the support surface of the support member 285, which is indicative of the temperature of the substrate disposed thereon. For example, a signal from the thermocouple may be used in a feedback loop to control the temperature or flow rate of the fluid circulated through the fluid channel 298.

The support member 285 can be moved vertically within the chamber body 212 so that a distance between support member 285 and the lid assembly 240 can be controlled. A sensor (not shown) can provide information concerning the position of support member 285 within chamber 200.

In operation, the support member 285 can be elevated to a close proximity of the lid assembly 240 to control the temperature of the substrate being processed. As such, the substrate can be heated via radiation emitted from the distribution plate 270. Alternatively, the substrate can be lifted off the support member 285 to close proximity of the heated lid assembly 240 using the lift pins 293 activated by the lift ring 295.

A system controller (not shown) can be used to regulate the operations of the processing chamber 200. The system controller can operate under the control of a computer program stored on a memory of a computer. The computer program may include instructions that enable the process described below to be performed in the processing chamber 200. For example, the computer program can dictate the process sequencing and timing, mixture of gases, chamber pressures, RF power levels, susceptor positioning, slit valve opening and closing, substrate cooling and other parameters of a particular process.

Figure 3:
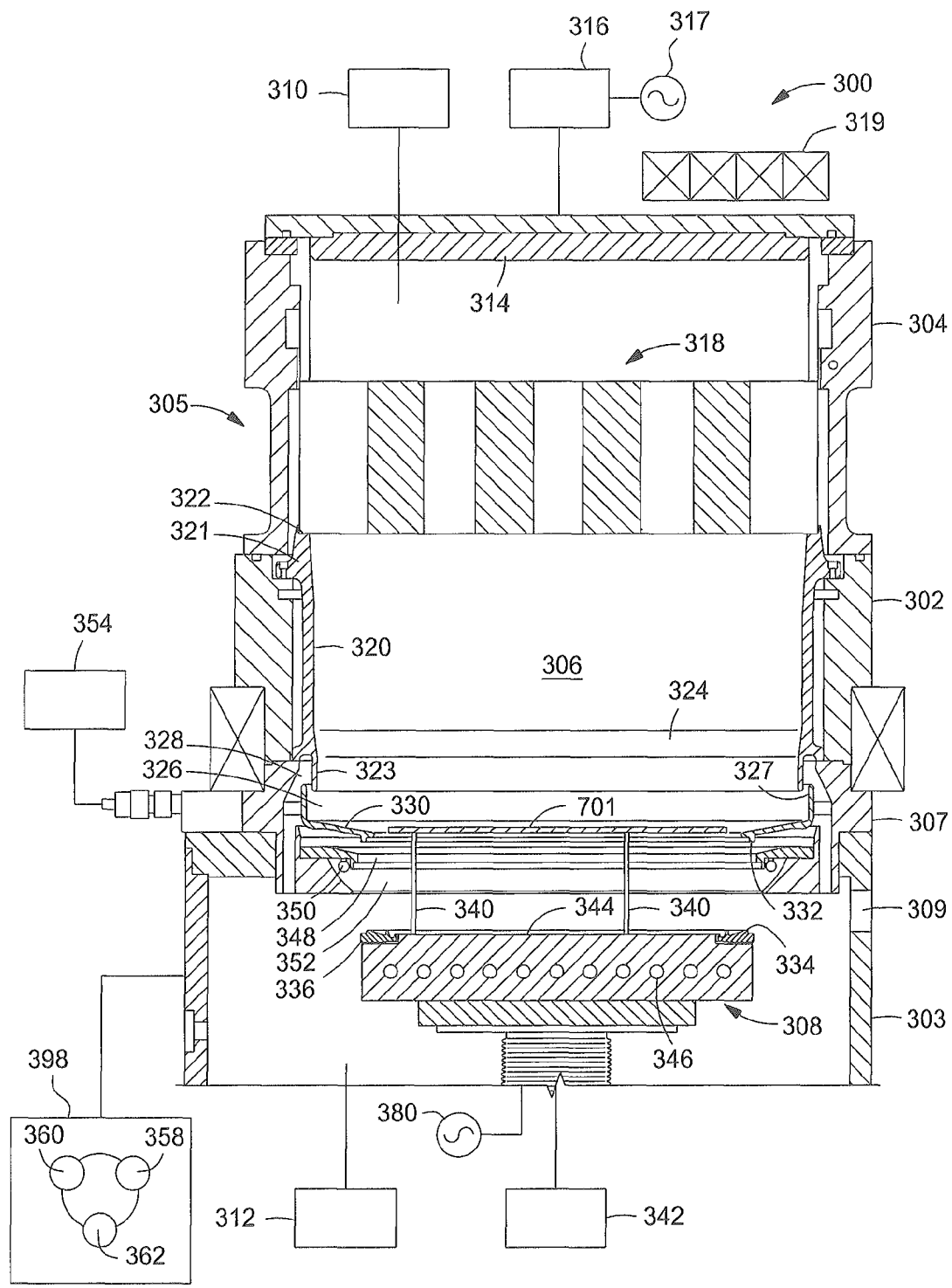
FIG. 3 depicts a schematic cross-sectional view of one embodiment of a process chamber utilizes to form a material layer on a substrate in accordance with the invention.

FIG. 3 illustrates an exemplary physical vapor deposition (PVD) chamber 300 (e.g., a sputter process chamber) suitable for sputter depositing materials according to one embodiment of the invention. Examples of suitable PVD chambers include the ALPS® Plus and SIP ENCORE® PVD processing chambers, both commercially available from Applied Materials, Inc., Santa Clara, of California. It is contemplated that processing chambers available from other manufactures may also be adapted to perform the embodiments described herein.

FIG. 3 is a schematic cross-sectional view of a deposition chamber 300 according to one embodiment. The deposition chamber 300 has an upper sidewall 302, a lower sidewall 303, and a lid portion 304 defining a body 305 that encloses an interior volume 306 thereof. An adapter plate 307 may be disposed between the upper sidewall 302 and the lower sidewall 303. A substrate support, such as a pedestal 308, is disposed in the interior volume 306 of the deposition chamber 300. A substrate transfer port 309 is formed in the lower sidewall 303 for transferring substrates into and out of the interior volume 306.

In one embodiment, the deposition chamber 300 comprises a sputtering chamber, also known as a physical vapor deposition (PVD) chamber, capable of depositing, for example, cobalt, cobalt alloy, titanium, aluminum oxide, aluminum, aluminum nitride, aluminum oxynitride, copper, tantalum, tantalum nitride, tantalum oxynitride, titanium oxynitride, tungsten, or tungsten nitride on a substrate, such as the substrate 701.

A gas source 310 is coupled to the deposition chamber 300 to supply process gases into the interior volume 306. In one embodiment, process gases may include inert gases, non-reactive gases, and reactive gases if necessary. Examples of process gases that may be provided by the gas source 310 include, but not limited to, argon gas (Ar), helium (He), neon gas (Ne), nitrogen gas ($N_2$), oxygen gas ($O_2$), and $H_2O$ among others.

A pumping device 312 is coupled to the deposition chamber 300 in communication with the interior volume 306 to control the pressure of the interior volume 306. In one embodiment, the pressure level of the deposition chamber 300 may be maintained at about 1 Torr or less. In another embodiment, the pressure level of the deposition chamber 300 may be maintained at about 500 milliTorr or less. In yet another embodiment, the pressure level of the deposition chamber 300 may be maintained at about 1 milliTorr and about 300 milliTorr.

The lid portion 304 may support a sputtering source 314, such as a target. In one embodiment, the sputtering source 314 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the sputtering source 314 may be fabricated by titanium (Ti) metal, tantalum metal (Ta) or aluminum (Al).

The sputtering source 314 may be coupled to a source power assembly 316 comprising a power supply 317 for the sputtering source 314. A set of magnets 319 may be coupled adjacent to the sputtering source 314 which enhances efficient sputtering materials from the sputtering source 314 during processing. Examples of the magnetron assembly include an electromagnetic linear magnetron, a serpentine magnetron, a spiral magnetron, a double-digitated magnetron, a rectangularized spiral magnetron, among others.

An additional RF power source 380 may also coupled to the deposition chamber 300 through the pedestal 308 to provide a bias power between the sputtering source 314 and the pedestal 308 as needed. In one embodiment, the RF power source 380 may have a frequency between about 1 MHz and about 100 MHz, such as about 13.56 MHz.

A collimator 318 may be positioned in the interior volume 306 between the sputtering source 314 and the pedestal 308. A shield tube 320 may be in proximity to the collimator 318 and interior of the lid portion 304. The collimator 318 includes a plurality of apertures to direct gas and/or material flux within the interior volume 306. The collimator 318 may be mechanically and electrically coupled to the shield tube 320. In one embodiment, the collimator 318 is mechanically coupled to the shield tube 320, such as by a welding process, making the collimator 318 integral to the shield tube 320. In another embodiment, the collimator 318 may be electrically floating within the chamber 300. In another embodiment, the collimator 318 may be coupled to an electrical power source and/or electrically coupled to the lid portion 304 of the body 305 of the deposition chamber 300.

The shield tube 320 may include a tubular body 321 having a recess 322 formed in an upper surface thereof. The recess 322 provides a mating interface with a lower surface of the collimator 318. The tubular body 321 of the shield tube 320 may include a shoulder region 323 having an inner diameter that is less than the inner diameter of the remainder of the tubular body 321. In one embodiment, the inner surface of the tubular body 321 transitions radially inward along a tapered surface 324 to an inner surface of the shoulder region 323. A shield ring 326 may be disposed in the chamber 300 adjacent to the shield tube 320 and intermediate of the shield tube 320 and the adapter plate 307. The shield ring 326 may be at least partially disposed in a recess 328 formed by an opposing side of the shoulder region 323 of the shield tube 320 and an interior sidewall of the adapter plate 307.

In one aspect, the shield ring 326 includes an axially projecting annular sidewall 327 that includes an inner diameter that is greater than an outer diameter of the shoulder region 323 of the shield tube 320. A radial flange 330 extends from the annular sidewall 327. The radial flange 330 may be formed at an angle greater than about ninety degrees (90°) relative to the inside diameter surface of the annular sidewall 327 of the shield ring 326. The radial flange 330 includes a protrusion 332 formed on a lower surface thereof. The protrusion 332 may be a circular ridge extending from the surface of the radial flange 330 in an orientation that is substantially parallel to the inside diameter surface of the annular sidewall 327 of the shield ring 326. The protrusion 332 is generally adapted to mate with a recessed flange 334 formed in an edge ring 336 disposed on the pedestal 308. The recessed flange 334 may be a circular groove formed in the edge ring 336. The engagement of the protrusion 332 and the recessed flange 334 centers the shield ring 326 with respect to the longitudinal axis of the pedestal 308. The substrate 701 (shown supported on lift pins 340) is centered relative to the longitudinal axis of the pedestal 308 by coordinated positioning calibration between the pedestal 308 and a robot blade (not shown). In this manner, the substrate 701 may be centered within the deposition chamber 300 and the shield ring 326 may be centered radially about the substrate 701 during processing.

In operation, a robot blade (not shown) having a substrate 701 thereon is extended through the substrate transfer port 309. The pedestal 308 may be lowered to allow the substrate 701 to be transferred to the lift pins 340 extending from the pedestal 308. Lifting and lowering of the pedestal 308 and/or the lift pins 340 may be controlled by a drive 342 coupled to the pedestal 308. The substrate 701 may be lowered onto a substrate receiving surface 344 of the pedestal 308. With the substrate 701 positioned on the substrate receiving surface 344 of the pedestal 308, sputter deposition may be performed on the substrate 701. The edge ring 336 may be electrically insulated from the substrate 701 during processing. Therefore, the substrate receiving surface 344 may include a height that is greater than a height of portions of the edge ring 336 adjacent the substrate 701 such that the substrate 701 is prevented from contacting the edge ring 336. During sputter deposition, the temperature of the substrate 701 may be controlled by utilizing thermal control channels 346 disposed in the pedestal 308.

After sputter deposition, the substrate 701 may be elevated utilizing the lift pins 340 to a position that is spaced away from the pedestal 308. The elevated location may be proximate one or both of the shield ring 326 and a reflector ring 348 adjacent to the adapter plate 307. The adapter plate 307 includes one or more lamps 350 coupled thereto intermediate of a lower surface of the reflector ring 348 and a concave surface 352 of the adapter plate 307. The lamps 350 provide optical and/or radiant energy in the visible or near visible wavelengths, such as in the infrared (IR) and/or ultraviolet (UV) spectrum. The energy from the lamps 350 is focused radially inward toward the backside (i.e., lower surface) of the substrate 701 to heat the substrate 701 and the material deposited thereon. Reflective surfaces on the chamber components surrounding the substrate 701 serve to focus the energy toward the backside of the substrate 701 and away from other chamber components where the energy would be lost and/or not utilized. The adapter plate 307 may be coupled to a coolant source 354 to control the temperature of the adapter plate 307 during heating.

After heating the substrate 701 to the desired temperature, the substrate 701 is lowered to a position on the substrate receiving surface 344 of the pedestal 308. The substrate 701 may be rapidly cooled utilizing the thermal control channels 346 in the pedestal 308 via conduction. The temperature of the substrate 701 may be ramped down from the first temperature to a second temperature in a matter of seconds to about a minute. The substrate 701 may be removed from the deposition chamber 300 through the substrate transfer port 309 for further processing. The substrate 701 may be maintained at a desired temperature range, such as less than 250 degrees Celsius as needed.

A controller 398 is coupled to the deposition chamber 300. The controller 398 includes a central processing unit (CPU) 360, a memory 358, and support circuits 362. The controller 398 is utilized to control the process sequence, regulating the gas flows from the gas source 310 into the deposition chamber 300 and controlling ion bombardment of the sputtering source 314. The CPU 360 may be of any form of a general purpose computer processor that can be used in an industrial setting. The software routines can be stored in the memory 358, such as random access memory, read only memory, floppy or hard disk drive, or other form of digital storage. The support circuits 362 are conventionally coupled to the CPU 360 and may comprise cache, clock circuits, input/output subsystems, power supplies, and the like. The software routines, when executed by the CPU 360, transform the CPU 360 into a specific purpose computer (controller) 398 that controls the deposition chamber 300 such that the processes are performed in accordance with the present invention. The software routines may also be stored and/or executed by a second controller (not shown) that is located remotely from the chamber 300.

During processing, material is sputtered from the sputtering source 314 and deposited on the surface of the substrate 701. The sputtering source 314 and the substrate support pedestal 308 are biased relative to each other by the power supply 317 or 380 to maintain a plasma formed from the process gases supplied by the gas source 310. The ions from the plasma are accelerated toward and strike the sputtering source 314, causing target material to be dislodged from the sputtering source 314. The dislodged target material and process gases forms a layer on the substrate 701 with desired compositions.

Figure 4:
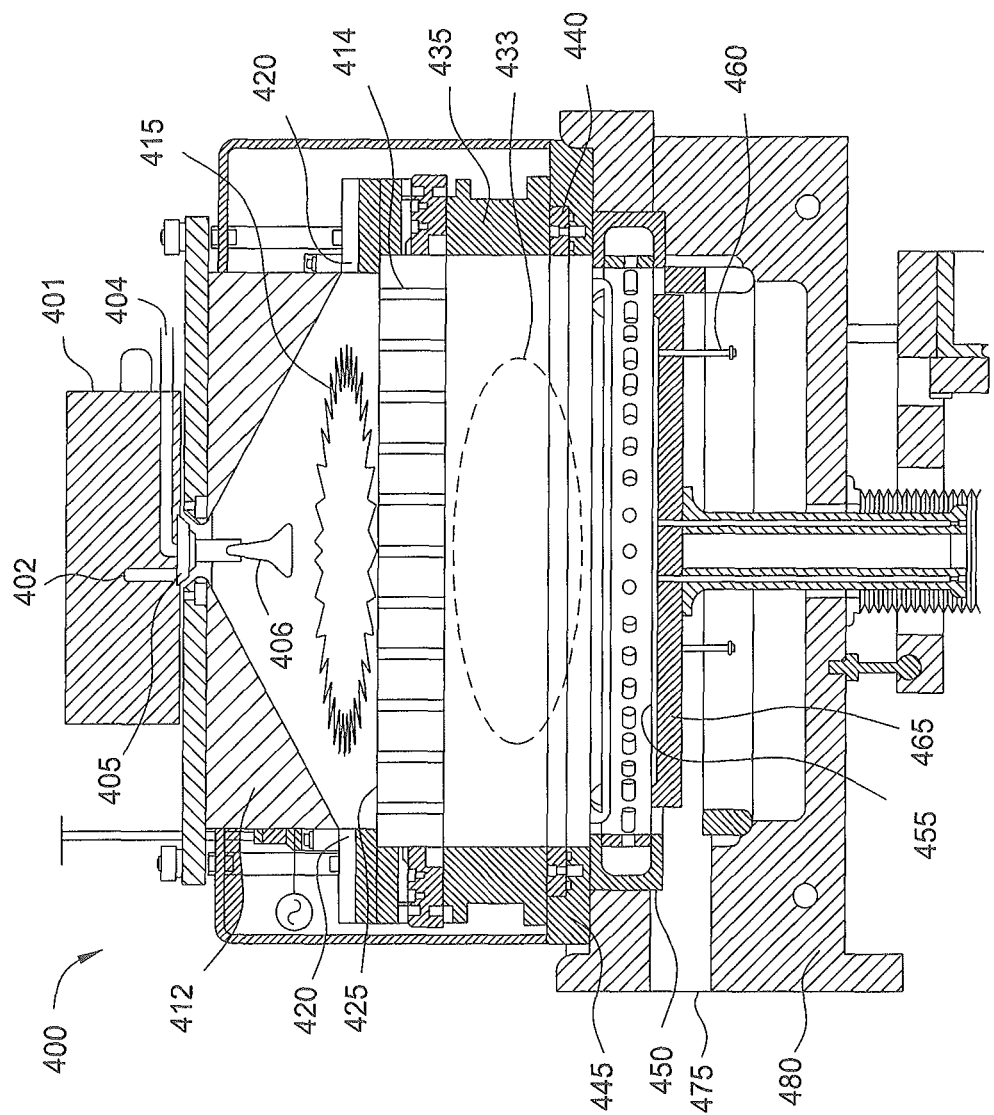
FIG. 4 depicts a schematic cross-sectional view of one embodiment of a process chamber utilizes to form a material layer on a substrate in accordance with the invention.

FIG. 4 is a cross-sectional view of one embodiment of a flowable chemical vapor deposition chamber 400 with partitioned plasma generation regions. The flowable chemical vapor deposition chamber 400 may be utilized to deposit a liner layer, such as a SiOC containing layer, onto a substrate. During film deposition (silicon oxide, silicon nitride, silicon oxynitride or silicon oxycarbide depositions), a process gas may be flowed into a first plasma region 415 through a gas inlet assembly 405. The process gas may be excited prior to entering the first plasma region 415 within a remote plasma system (RPS) 401. The deposition chamber 400 includes a lid 412 and showerhead 425. The lid 412 is depicted with an applied AC voltage source and the showerhead 425 is grounded, consistent with plasma generation in the first plasma region 415. An insulating ring 420 is positioned between the lid 412 and the showerhead 425 enabling a capacitively coupled plasma (CCP) to be formed in the first plasma region 415. The lid 412 and showerhead 425 are shown with an insulating ring 420 in between, which allows an AC potential to be applied to the lid 412 relative to the showerhead 425.

The lid 412 may be a dual-source lid for use with a processing chamber. Two distinct gas supply channels are visible within the gas inlet assembly 405. A first channel 402 carries a gas that passes through the remote plasma system (RPS) 401, while a second channel 404 bypasses the RPS 401. The first channel 402 may be used for the process gas and the second channel 404 may be used for a treatment gas. The gases that flow into the first plasma region 415 may be dispersed by a baffle 406.

A fluid, such as a precursor, may be flowed into a second plasma region 433 of the deposition chamber 400 through the showerhead 425. Excited species derived from the precursor in the first plasma region 415 travel through apertures 414 in the showerhead 425 and react with the precursor flowing into the second plasma region 433 from the showerhead 425. Little or no plasma is present in the second plasma region 433. Excited derivatives of the precursor combine in the second plasma region 433 to form a flowable dielectric material on the substrate. As the dielectric material grows, more recently added material possesses a higher mobility than underlying material. Mobility decreases as organic content is reduced by evaporation. Gaps may be filled by the flowable dielectric material using this technique without leaving traditional densities of organic content within the dielectric material after deposition is completed. A curing step may still be used to further reduce or remove the organic content from a deposited film.

Exciting the precursor in the first plasma region 415 alone or in combination with the remote plasma system (RPS) 401 provides several benefits. The concentration of the excited species derived from the precursor may be increased within the second plasma region 433 due to the plasma in the first plasma region 415. This increase may result from the location of the plasma in the first plasma region 415. The second plasma region 433 is located closer to the first plasma region 415 than the remote plasma system (RPS) 401, leaving less time for the excited species to leave excited states through collisions with other gas molecules, walls of the chamber and surfaces of the showerhead.

The uniformity of the concentration of the excited species derived from the precursor may also be increased within the second plasma region 433. This may result from the shape of the first plasma region 415, which is more similar to the shape of the second plasma region 433. Excited species created in the remote plasma system (RPS) 401 travel greater distances in order to pass through apertures 414 near the edges of the showerhead 425 relative to species that pass through apertures 414 near the center of the showerhead 425. The greater distance results in a reduced excitation of the excited species and, for example, may result in a slower growth rate near the edge of a substrate. Exciting the precursor in the first plasma region 415 mitigates this variation.

In addition to the precursors, there may be other gases introduced at varied times for varied purposes. A treatment gas may be introduced to remove unwanted species from the chamber walls, the substrate, the deposited film and/or the film during deposition. The treatment gas may comprise at least one of the gases from the group comprising of $H_2$, an $H_2/N_2$ mixture, $NH_3$, $NH_4OH$, $O_3$, $O_2$, $H_2O_2$ and water vapor. A treatment gas may be excited in a plasma and then used to reduce or remove a residual organic content from the deposited film. In other embodiments, the treatment gas may be used without a plasma. When the treatment gas includes water vapor, the delivery may be achieved using a mass flow meter (MFM) and injection valve or by other suitable water vapor generators.

In the embodiment, the dielectric layer can be deposited by introducing dielectric material precursors, e.g., a silicon containing precursor, and reacting processing precursors in the second plasma region 433. Examples of dielectric material precursors are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$—containing precursors, such as sillyl-amine and its derivatives including trisillylamine (TSA) and disillylamine (DSA), $Si_xN_yH_zO_{zz}$—containing precursors, $Si_xN_yH_zCl_{zz}$—containing precursors, or combinations thereof.

Processing precursors include hydrogen-containing compounds, oxygen-containing compounds, nitrogen-containing compounds, or combinations thereof. Examples of suitable processing precursors include one or more of compounds selected from the group comprising of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing precursors may be plasma exited, such as in the RPS unit, to include N* and/or H* and/or O*-containing radicals or plasma, for example, $NH_3$, $NH_2$*, NH*, N*, H*, O*, N*O*, or combinations thereof. The process precursors may alternatively, include one or more of the precursors described herein.

The processing precursors may be plasma excited in the first plasma region 415 to produce process gas plasma and radicals including N* and/or H* and/or O* containing radicals or plasma, for example, $NH_3$, $NH_2$*, NH*, N*, H*, O*, N*O*, or combinations thereof. Alternatively, the processing precursors may already be in a plasma state after passing through a remote plasma system prior to introduction to the first plasma region 415.

The excited processing precursor 490 is then delivered to the second plasma region 433 for reaction with the precursors though apertures 414. Once in the processing volume, the processing precursor may mix and react to deposit the dielectric materials.

In one embodiment, the flowable CVD process performed in the deposition chamber 400 may deposit the dielectric materials as a polysilazanes based silicon containing film (PSZ-like film), which may be reflowable and fillable within trenches, features, vias, or other apertures defined in a substrate where the polysilazanes based silicon containing film is deposited.

In addition to the dielectric material precursors and processing precursors, there may be other gases introduced at varied times for varied purposes. A treatment gas may be introduced to remove unwanted species from the chamber walls, the substrate, the deposited film and/or the film during deposition, such as hydrogen, carbon, and fluorine. A processing precursor and/or treatment gas may comprise at least one of the gases from the group comprising $H_2$, a $H_2/N_2$ mixture, $NH_3$, $NH_4OH$, $O_3$, $O_2$, $H_2O_2$, $N_2$, $N_2H_4$ vapor, NO, $N_2O$, $NO_2$, water vapor, or combinations thereof. A treatment gas may be excited in a plasma and then used to reduce or remove a residual organic content from the deposited film. In other disclosed embodiments the treatment gas may be used without a plasma. When the treatment gas includes water vapor, the delivery may be achieved using a mass flow meter (MFM) and injection valve or by commercially available water vapor generators. The treatment gas may be introduced from into the first processing region, either through the RPS unit or bypassing the RPS unit, and may further be excited in the first plasma region.

Silicon nitrides materials include silicon nitride, $Si_xN_y$, hydrogen-containing silicon nitrides, $Si_xN_yH_z$, silicon oxynitrides, including hydrogen-containing silicon oxynitrides, $Si_xN_yH_zO_{zz}$, and halogen-containing silicon nitrides, including chlorinated silicon nitrides, $Si_xN_yH_z$-$Cl_{zz}$. The deposited dielectric material may then be converted to a silicon oxide like material.

Figure 5:
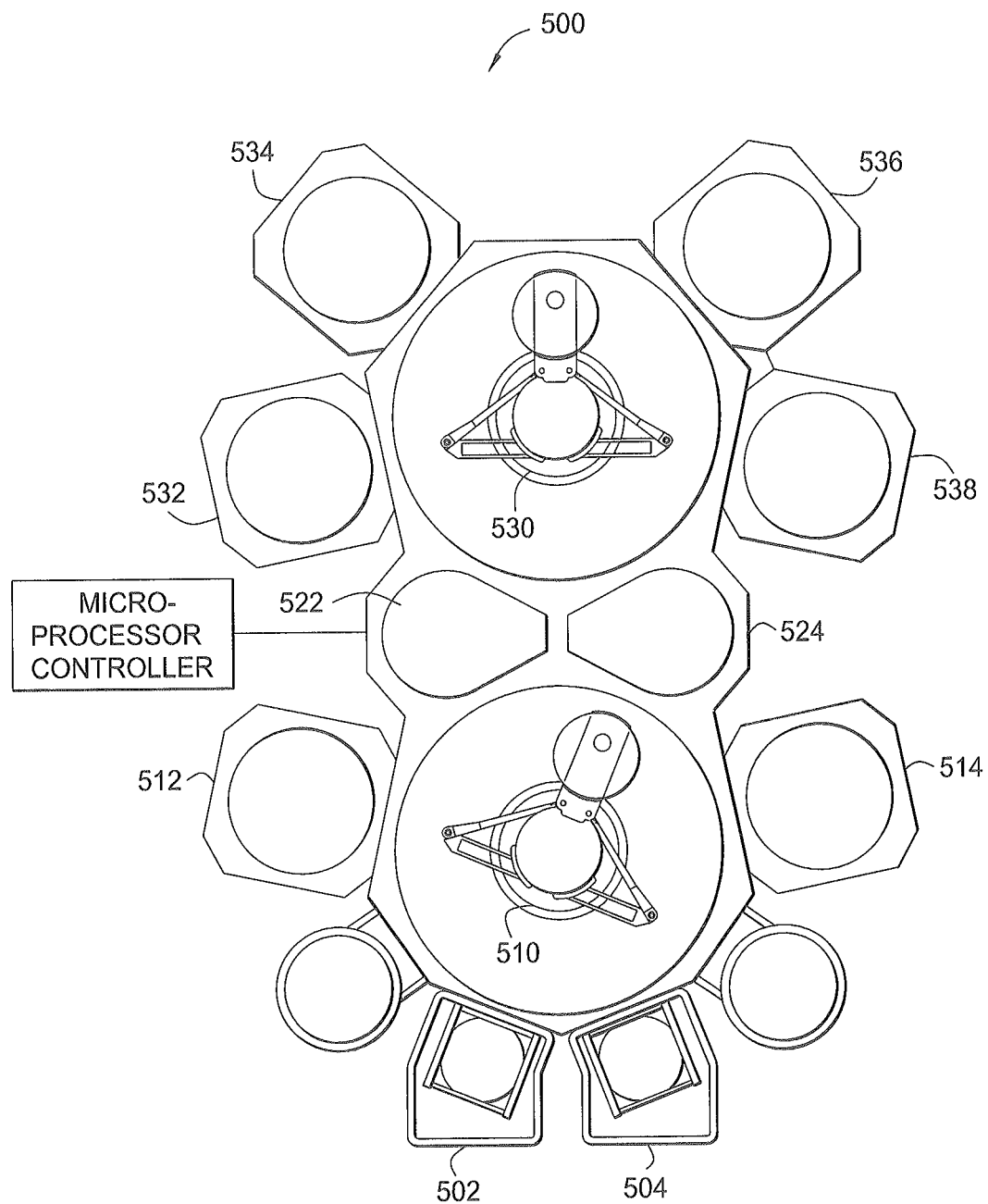
FIG. 5 depicts a schematic top-view diagram of an illustrative multi-chamber processing system.

FIG. 5 is a schematic top-view diagram of an illustrative multi-chamber processing system 500 that can be adapted to perform processes as disclosed herein having the processing chamber 500 coupled thereto. The system 500 may include multiple processing chambers, such as the processing chambers 100, 200, 300, 400 depicted in FIGS. 1-4, incorporated into the system 500. The system 500 can include one or more load lock chambers 502, 504 for transferring substrates into and out of the system 500. Typically, since the system 500 is under vacuum, the load lock chambers 502, 504 can "pump down" the substrates being introduced into the system 500. A first robot 510 can transfer the substrates between the load lock chambers 502, 504, and a first set of one or more substrate processing chambers 511, 512, 513, 514 (four are shown). Each processing chamber 511, 512, 513, 514 is configured to perform at least one of substrate processing operation, such as an etching process, cyclical layer deposition (CLD), atomic layer deposition (ALD), treatment process, cyclical etching process, plasma enhanced chemical vapor deposition (PE CVD), flowable chemical vapor deposition (CVD), physical vapor deposition (PVD), degas, pre-cleaning, orientation and other substrate processes. The position of the processing chambers 511, 512, 513, 514 utilized to perform the processes relative to the other chambers 100, 200, 300, 400 is for illustration, and the position of the processing chambers 100, 200, 300, 400 may be optionally be switched with any one of the processing chambers 511, 512, 513, 514 if desired. As discussed above, the processing chambers 100, 200, 300, 400 as depicted above with reference above to FIGS. 1-4 are configured to perform at least one of substrate processing operation, such as an etching process, cyclical layer deposition (CLD), atomic layer deposition (ALD), treatment process, cyclical etching process, plasma enhanced chemical vapor deposition (PE CVD), flowable chemical vapor deposition (CVD), physical vapor deposition (PVD), degas, pre-cleaning, orientation and other substrate processes.

The first robot 510 can also transfer substrates to/from one or more transfer chambers 522, 524. The transfer chambers 522, 524 can be used to maintain ultra-high vacuum conditions while allowing substrates to be transferred within the system 500. A second robot 530 can transfer the substrates between the transfer chambers 522, 524 and the second set of the one or more processing chambers 100, 200, 300, 400. Similar to processing chambers 511, 512, 513, 514, the processing chambers 100, 200, 300, 400 can be outfitted to perform a variety of substrate processing operations including the dry etch processes described herein any other suitable process including an etching process, cyclical layer deposition (OLD), atomic layer deposition (ALD), treatment process, cyclical etching process, plasma enhanced chemical vapor deposition (PE CVD), flowable chemical vapor deposition (CVD), physical vapor deposition (PVD), degas, pre-cleaning, orientation and other substrate processes, for example. Any of the substrate processing chambers 511, 512, 513, 514, 100, 200, 300, 400, can be removed from the system 500 if not necessary for a particular process to be performed by the system 500.

Figure 6:
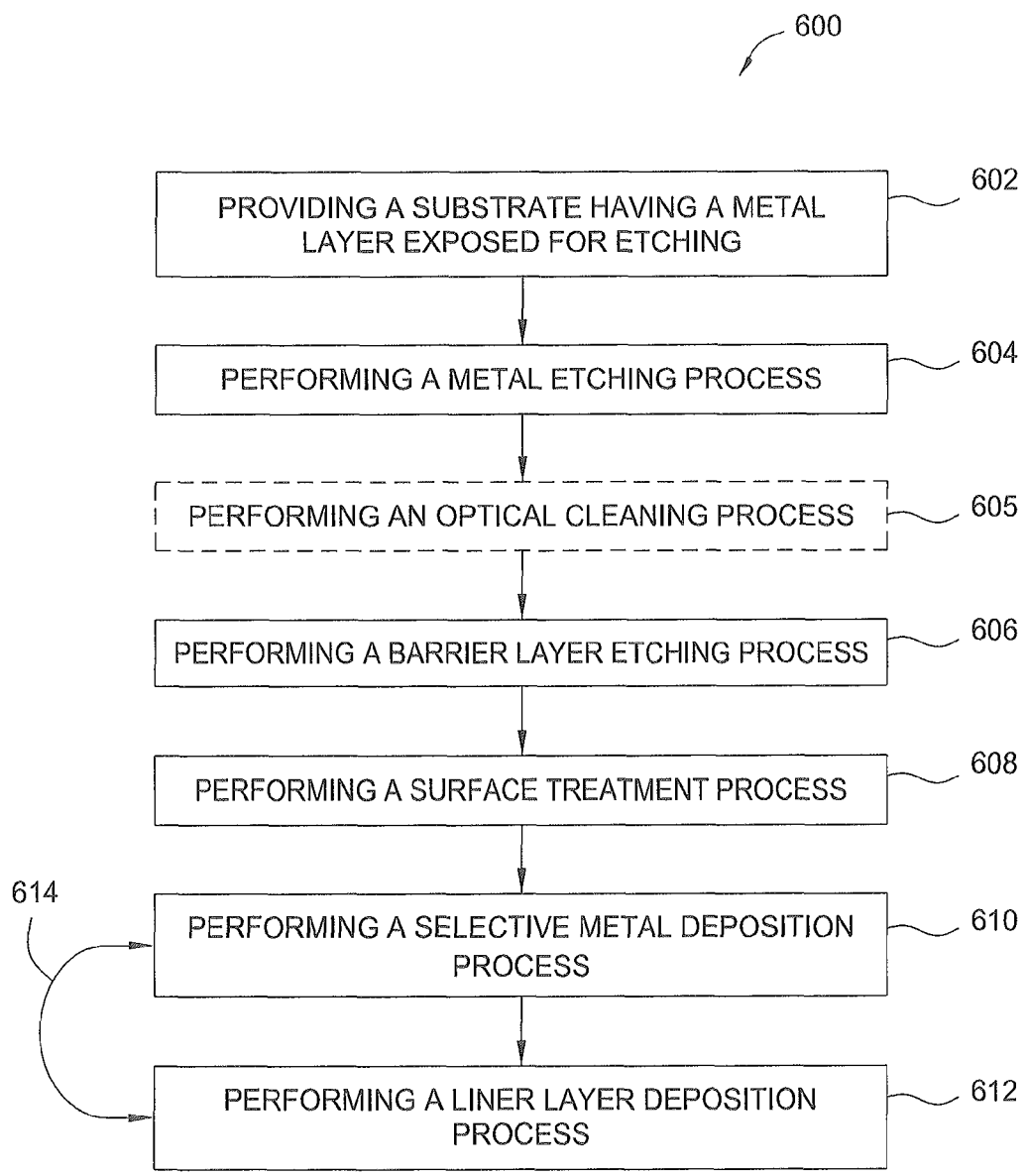
FIG. 6 depicts a flow diagram of a method for forming interconnection structure in accordance with one embodiment of the present invention.

FIG. 6 is a flow diagram of one embodiment of a method 600 for manufacturing an interconnection structure for semiconductor devices. The method for manufacturing the interconnection structure may include several process steps of different techniques, such as etching process, treatment process, deposition process, or cleaning process as needed. The method 600 may be performed in a processing system (i.e., a cluster system), such as the processing system 500 depicted in FIG. 5. FIGS. 7A-7F and FIGS. 8A-8C are schematic cross-sectional view illustrating two sequences for manufacturing two embodiments of interconnection structures disposed on a substrate according to the method 600 with different process step orders and sequences. Although the method 600 is described below with reference to a substrate having a metal layer utilized to form an interconnection structure, the method 600 may also be used to advantage in other transistor device manufacture applications.

The method 600 begins at block 602 by transferring a substrate, such as the substrate 701, into a processing chamber, such as the processing chamber 100 in FIG. 1. The substrate 701 may be a silicon based material or any suitable insulating materials or conductive materials as needed, having a metal layer 708 disposed on the substrate 701 that may be utilized to form an interconnection structure 700 in the metal layer 708, as shown in FIG. 7A.

Figure 7A:
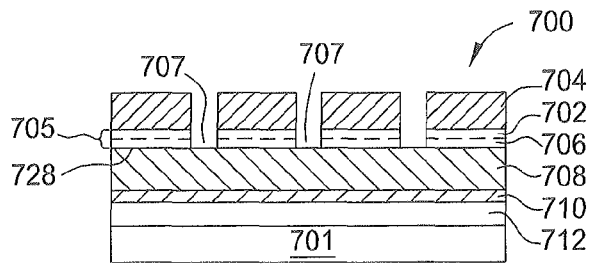
FIGS. 7A-7F depict one embodiment of a sequence for forming the interconnection structure on a substrate in accordance with the embodiment depicted in FIG. 5.

In one particular embodiment, the substrate 701 may have a barrier layer 710 disposed between the metal layer 708 and a low-k insulating dielectric material 712, as shown in dotted line in FIG. 7A. Suitable example of the barrier layer 710 includes TaN, TiN, AlN, TaSiN, TiSiN, AlO, AlON, AlN, or other suitable materials. Suitable examples of the low-k insulating dielectric material 712 includes organic materials, SiO containing materials, SiN containing materials, SiOC containing materials, SiC containing materials, carbon based materials, or any other suitable materials. Examples of suitable materials include carbon-containing silicon oxides (SiOC), such as BLACK DIAMOND® dielectric material and other low-k polymers, such as polyamides.

As shown in the exemplary embodiment depicted in FIG. 7A, the substrate 701 may have a substantially planar surface, an uneven surface, or a substantially planar surface having a structure formed thereon. In one embodiment, the substrate 701 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 701 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 701, the substrate 701 may include a buried dielectric layer disposed on a silicon crystalline substrate. In the embodiment depicted herein, the substrate 701 may be a crystalline silicon substrate.

In one embodiment, the metal layer 708 is disposed on the substrate 701. Suitable examples of the metal layer 708 includes tungsten (W), tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and combinations thereof, among others. In the embodiment depicted in FIGS. 7A-7F and 8A-8C, the metal layer 708 is a copper layer or a copper alloy layer having a thickness between about 100 Å and about 5000 Å, such as about 500 Å.

A lithographically patterned resist layer 704 along with a hardmask layer 705 is then formed over the metal layer 708 exposing portions 707 of the metal layer 708 for etching. In one embodiment, the lithographically patterned resist layer 704 may is a positive tone photoresist, a negative tone photoresist, a UV lithography photoresist, an line photoresist, photoresist, an e-beam resist (for example, a chemically amplified resist (CAR)) or other suitable photoresist. In one example, the lithographically patterned resist layer 704 may include organic polymer materials, such as fluoropolymers, silicon-containing polymers, hydroxy styrene, or acrylic acid monomers to provide acid groups when the hardmask layer 705 is exposed to radiation. The hardmask layer 705 may be fabricated by a dielectric layer or a metal containing layer. The hardmask layer 705 may be a single layer of dielectric material or a metal containing layer, composite layers of dielectric materials and metal containing materials, or a film stack including multiple layers. In the embodiment depicted in FIG. 7A, the hardmask layer 705 is a dual layer stack, including an upper layer 702 disposed on a lower layer 706, utilized to serve as an etching mask during the etching process. In one embodiment, the upper layer 702 is a dielectric layer selected from a group consisting of silicon oxide, silicon oxynitride, silicon carbide, amorphous carbon, silicon carbon-nitride (SiCN), silicon nitride and the like, and the lower layer 706 is a metal containing layer selected from a group consisting of metal silicide, TaN, TiN, AlN, TaSiN, TiSiN, AlO, AlON, MnN, CoWP, NiW, W, refractory metal nitrides, or AlN. Additional dielectric layers may be inserted between the upper layer 702 and the lower layer 706, above the upper layer 702, or below the lower layer 706 as needed.

In one embodiment, the features formed in the lithographically patterned resist layer 704 may be transferred to the hardmask layer 705 in the previously performed patterning process. The lithographically patterned resist layer 704 may be partially or entirely consumed during the processes of transferring features from the lithographically patterned resist layer 704 to the hardmask layer 705. During the metal layer etching process, the hardmask layer 705 is mostly relied on as the etching mask to etch the metal layer 708. In the embodiment depicted in FIG. 7A, some portion of the lithographically patterned resist layer 704 is still remained on the substrate 701 together with the patterned hardmask layer 705 to etch the metal layer 708 during the metal etching/patterning process.

Figure 7B:
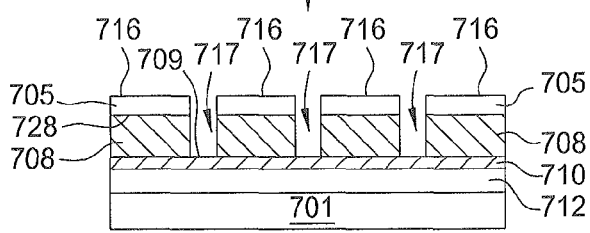

At block 604, an etching process is performed to etch the metal layer 708 using the hardmask layer 705 and/or lithographically patterned resist layer 704, if any, as an etching mask. The etching gas mixture is supplied into the processing chamber 100 to etch the portions 707 of the metal layer 702 exposed by the patterned hardmask layer 705 until an underlying surface 709 of the barrier layer 710 is exposed, forming features 717 in the metal layer 708, as shown in FIG. 7B. The patterned hardmask layer 705 along with the lithographically patterned resist layer 704, if any, servers as an etching mask during the etching process of the metal layer 708. In most of the embodiments, the lithographically patterned resist layer 704 are consumed and used up after the metal layer patterning process, mainly leaving the patterned hardmask layer 705 on the substrate for the subsequent processes.

In one embodiment, the etching gas mixture is continuously supplied to etch the metal layer 708 until the desired feature 717 is formed in the metal layer 708, exposing the underlying surface 709 of the barrier layer 710. The etching gas mixture selected to etch the metal layer 708 includes at least a hydrocarbon containing gas having a formula $C_xH_y$, wherein x and y are integers ranging from 1 to 8 and 4 to 18 respectively. Suitable examples of the hydrocarbon containing gas include methane ($CH_4$), ethane ($C_2H_6$), propane ($C_3H_8$), butane ($C_4H_{10}$), pentane ($C_5H_{12}$), hexane ($C_6H_{14}$), propene, ethylene, propylene, butylene, pentene, combinations thereof and the like. In a particular embodiment, the hydrocarbon compound is methane ($CH_4$).

While supplying the etching gas mixture, an inert gas may also be supplied into the etching gas mixture to assist the profile control as needed. Examples of the inert gas supplied in the gas mixture include Ar, He, Ne, Kr, Xe or the like. In one embodiment, the hydrocarbon gas supplied in the etching gas mixture may be maintained at a flow rate by volume between about 30 sccm and about 150 sccm. The optional inert gas may be supplied to the processing chamber at a flow rate by volume between about 50 sccm and about 300 sccm.

After the etching gas mixture is supplied to the processing chamber mixture, a RF source power is supplied to form a plasma from the etching gas mixture therein. The RF source power may be supplied at the etching gas mixture between about 1000 Watts and about 3000 Watts and at a frequency between about 400 kHz and about 13.56 MHz. A RF bias power may also be supplied as needed. The RF bias power may be supplied at between about 300 Watts and about 1500 Watts. In one embodiment, the RF source power may be pulsed with a duty cycle between about 10 to about 95 percent at a RF frequency between about 500 Hz and about 10 MHz.

Several process parameters may also be controlled while supplying the etching gas mixture to perform the etching process. The pressure of the processing chamber may be controlled at between about 0.5 milliTorr and about 500 milliTorr, such as between about 2 milliTorr and about 10 milliTorr. A substrate temperature is maintained between about 15 degrees Celsius to about 300 degrees Celsius, such as greater than 50 degrees Celsius, for example between about 60 degrees Celsius and about 90 degrees Celsius. It is believed that high temperature, temperature greater than 50 degrees Celsius, helps reduce the amount of etching byproduct deposition on the substrate. The etching process may be performed for between about 30 seconds and about 180 seconds to etch the metal layer 708 with a thickness for between about 200 Å and about 1200 Å.

Figure 7C:
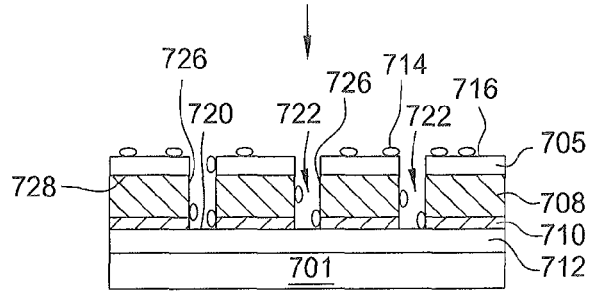

At block 605, an optional cleaning process may be performed to remove etching by-products or other contaminants from the substrate surface. After etching, etching by-products 714 generated during the etching process at block 604, as shown in FIG. 7C. During the etching process, etching by-product 714, if any, may be adversely accumulated or adhered on surfaces of the substrate surface. Accordingly, a cleaning process is necessary to maintain cleanness of the substrate surface when etching by-products 714 are present and remained on the substrate 701.

In the embodiment, the cleaning process may be a wet process that immersing, dipping, flooding or soaking the substrate 701 into a solution comprising peroxide with organic solvent. In another embodiment, the cleaning process may be a dry plasma process that may remove the etching by-product 714 and/or the contaminants from the substrate 701 by a plasma (dry) environment with halogen-based, hydrogen based, or oxygen based chemistry. The etching by-product 714 are mostly hydro-carbon-copper complex, such as $CH_xCu_yH_z$, like compounds (x, y, z are integers), which are not formed in gas phase to be readily pumped out from the processing chamber, but become solid precipitate falling on the substrate surface. The cleaning process as performed may be efficiently and timely remove the etching by-product 714 from the substrate surface, leaving a surface without contaminations.

Figure 7D:
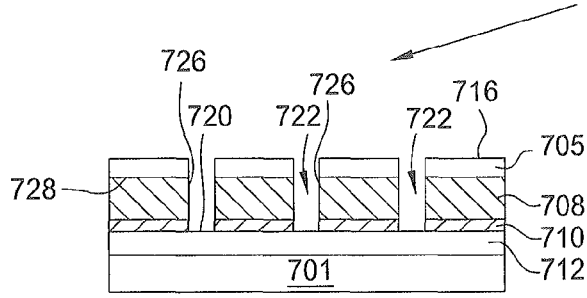

At block 606, after the optional cleaning process, a barrier layer etching process is performed to etch the barrier layer 710, until an underlying surface 720 of the low-k insulating dielectric material 712 is exposed, as show in FIG. 7D. Suitable materials for the barrier layer 710 include metal silicide, TaN, TiN, AlN, TaSiN, TiSiN, AlO, AlON, MnN, CoWP, NiW, W, refractory metal nitrides, AlN, and the like. In one particular embodiment depicted in FIGS. 7A-7F and 8A-8C, the barrier layer 710 is a TaN layer. The barrier layer etching process may be performed in a processing chamber, such as the processing chamber 200 depicted in FIG. 2 incorporated into the processing system 500, the same system where the processing chamber 100 utilized to etch the metal layer 708 is incorporated thereto. Alternatively, the barrier layer etching process may also be performed in the processing chamber 100 where the metal layer etching process is performed, so as to maintain both the metal layer etching and the barrier layer etching process under the same processing environment without breaking vacuum.

The barrier layer etching process may include multiple steps to incrementally and gradually etch the barrier layer 710 without damaging the underlying low-k insulating dielectric material 712. In one embodiment, the barrier layer etching process includes at least three steps (or more) to incrementally etch the barrier layer 710.

In a first step during the barrier layer etching process at block 606, a treatment process is performed to treat the barrier layer 710 to alter the surface properties to facilitate removal of the barrier layer 710 in the subsequent etching process. The treatment process performed at first step includes supplying a treatment gas mixture into a processing chamber, such as the chamber 200 depicted in FIG. 2. A plasma is then formed from the treatment gas mixture to plasma treat the surfaces 709 of the barrier layer 710 exposed by the features 722 of the metal layer 708. The treatment process activates the barrier layer 710 into an excited state, forming a treated barrier layer 710 in the area unprotected by the metal layer 708. The barrier layer 710 after treatment may then easily react with etching gases subsequently supplied into the processing chamber 200, forming volatile gas byproducts which readily pump out of the processing chamber 200.

In one embodiment, the treatment gas mixture includes at least one of an inert gas, a hydrogen containing gas or a nitrogen containing gas. It is believed that the inert gas, hydrogen containing gas or the nitrogen containing gas supplied in the treatment gas mixture may assist increasing the lifetime of the ions in the plasma formed from the treatment gas mixture. Increased lifetime of the ions may assist reacting with and activating the barrier layer 710 on the substrate 701 more thoroughly, thereby enhancing the removal of the activated barrier layer 710 from the substrate 701 during the subsequent etching process.

In one embodiment, the inert gas utilized to perform the treatment process may be Ar gas, He gas, Kr or the like. In embodiment wherein a hydrogen containing gas is utilized, the hydrogen containing gas may include at least one of $H_2$, $H_2O$, $NH_3$ and the like. In embodiment wherein a nitrogen containing gas is utilized, the nitrogen containing gas may include at least one of $N_2$, $N_2O$, $NO_2$, $NH_3$ and the like. In an exemplary embodiment, the inert gas supplied in the processing chamber 200 to perform the treatment process is He gas.

During the plasma treatment process, several process parameters may be regulated to control the treatment process. In one exemplary embodiment, a process pressure in the processing chamber 100 is regulated between about 10 mTorr to about 5000 mTorr, such as between about 50 mTorr and about 300 mTorr. A RF bias power at a frequency of about 13 MHz may be applied to maintain a plasma in the treatment gas mixture. For example, a RF bias power of about less than 550 Watts, such as about 100 Watts to about 500 Watts may be applied to maintain a plasma inside the processing chamber 200. The treatment gas mixture may be flowed into the chamber at a rate between about 50 sccm to about 200 sccm. A substrate temperature is maintained between about 25 degrees Celsius to about 300 degrees Celsius, such as between about 50 degrees Celsius and about 140 degrees Celsius, for example between about 50 degrees Celsius and about 130 degrees Celsius, such as about 110 degrees Celsius.

In one embodiment, the substrate 701 is subjected to the treatment process for between about 5 seconds to about 5 minutes, depending on the operating temperature, pressure and flow rate of the gas. For example, the substrate 701 can be exposed to the treatment processes for about 30 seconds to about 90 seconds. In an exemplary embodiment, the substrate is exposed to the treatment process for about 90 seconds or less.

Subsequent to the treatment process, a second step of the barrier layer etching process at block 606 is performed. At the second step, a remote plasma etching process is performed on the substrate 701 to etch the barrier layer 710 after the treatment process is performed on the substrate 701. The remote plasma etching process is a gentle etching process performed to slowly remove the barrier layer 710 exposed by the metal layer 708 on the substrate 701. The remote plasma etching process is performed by supplying an etching gas mixture into the plasma cavity 250 into the processing chamber 200 to form a remote plasma in the plasma cavity 250 from the processing gas mixture prior to flow the processing gas for etching the barrier layer 710 after the treatment process.

In one embodiment, the etching gas mixture used to remove the barrier layer 710 is a mixture of ammonia ($NH_3$) gas and nitrogen trifluoride ($NF_3$) gas. The ammonia ($NH_3$) gas used in the etching gas mixture may be replaced with $N_2$ gas as needed. Additionally gases, such as $H_2$, Ar, He, may also be added to the etching gas mixture to improve the etching efficiency. The amount of each gas introduced into the processing chamber may be varied and adjusted to accommodate, for example, the thickness of the barrier layer 710 to be removed, the geometry of the substrate being processed, the volume capacity of the plasma cavity, the volume capacity of the chamber body, as well as the capabilities of the vacuum system coupled to the chamber body.

As the plasma is generated remotely in the plasma cavity 250, the etchants dissociated from the etching gas mixture from the remote plasma is relatively mild and gentle, so as to slowly, gently and gradually chemically react the barrier layer 710 until the underlying low-k insulating dielectric material 712 is exposed, as shown in FIG. 7D. It is believed that in the remote plasma source, ammonia ($NH_3$) gas and the nitrogen trifluoride ($NF_3$) gas are dissociated in the remote plasma cavity 250, forming ammonium fluoride ($NH_4F$) and/or ammonium fluoride with HF ($NH_4F.HF$). Once the etchants of ammonium fluoride ($NH_4F$) and ammonium fluoride with HF ($NH_4F.HF$) are introduced into the processing region 241 of the processing chamber 200, the etchants of ammonium fluoride ($NH_4F$) and ammonium fluoride with HF ($NH_4F.HF$) may react with the barrier layer 710 upon reaching the substrate, forming $NH_4$ containing salt mostly in a solid state. The etchants of ammonium fluoride ($NH_4F$) and ammonium fluoride with HF ($NH_4F.HF$) chemically react the barrier layer 710, forming $NH_4$ containing salt in solid state, which will be later removed from the substrate surface by using a low temperature sublimation process.

In one or more embodiments, the gases added to provide the etching gas mixture having at least a 1:1 molar ratio of ammonia ($NH_3$) to nitrogen trifluoride ($NF_3$). In one or more embodiments, the molar ratio of the etching gas mixture is at least about 3:1 (ammonia to nitrogen trifluoride). The gases are introduced in the processing chamber 100 at a molar ratio of about 5:1 (ammonia to nitrogen trifluoride) to about 20:1. In yet another embodiment, the molar ratio of the etching gas mixture is about 5:1 (ammonia to nitrogen trifluoride) to about 10:1.

In one embodiment, other types of gas, such as inert gas or carrier gas, may also be supplied in the etching gas mixture to assist carrying the etching gas mixture into the processing region 241 of the etch processing chamber 100. Suitable examples of the inert gas or carrier gas include at least one of Ar, He, $N_2$, $H_2$, $O_2$, $N_2O$, $NO_2$, NO, and the like. In one embodiment, the inert or carrier gas may be supplied into the processing chamber 200 is Ar or He and $H_2$ or $N_2$ at a volumetric flow rate of between about 500 sccm and about 2000 sccm.

While supplying the etching gas mixture to perform the remote plasma source etching process, a substrate temperature may be maintained at a range of between about 40 degrees Celsius and about 150 degrees Celsius, such as about 110 degrees Celsius. After the etching gas mixture is supplied into the processing chamber, the barrier layer 710 may be then etched, forming solid etching byproduct, such as ammonium salt on the substrate surface. The etching byproduct, ammonium salt, remaining on the substrate 701 has a relatively low melting point, such as about 100 degrees Celsius, which allows the byproduct, ammonium salt, to be removed from the substrate by a sublimation process performed at the following third step. The etching process may be continuously performed until the barrier layer 710 disposed on the substrate 701 has all been reacted and converted to the etching byproduct.

During the etching process, several process parameters may be regulated to control the etching process. In one exemplary embodiment, a process pressure in the processing chamber 100 is regulated to between about 500 mTorr to about 5000 mTorr, such as between about 500 mTorr and about 2000. A RF source power at a frequency of about 80 KHz may be applied to maintain a plasma in the etching gas mixture. For example, a RF source power of about 20 Watts to about 800 Watts, such as about 300 Watts and about 800 Watts, for example about 600 Watts, may be applied to the etching gas mixture. The RF source power as referred herein may be the RF power supplied from the power source 252 to the electrodes 243, 245. In one embodiment, the RF source power may provide power at a frequency of about 80 KHz.

At the third step of the barrier layer etching process of block 606, after the etching process is completed and the barrier layer 710 has substantially reacted and converted to the etching byproduct, a sublimation process is performed to sublimate the etching byproduct into a volatile state which can be pumped out of the processing chamber 200. The sublimation process removes the etching byproduct from the substrate 701. The sublimation process may be performed in the same chamber where the treatment process and the remote plasma etching process where the first and the second steps are performed, such as the processing chamber 200 as described above. Alternatively, the sublimation process may be performed at a separate processing chamber of the system 500 as needed.

The sublimation process may be a plasma anneal process utilizing a plasma energy to sublimate the etching byproduct from the substrate 701. The thermal energy from the plasma may efficiently remove the etching byproduct, by the nature of the low melting (sublimation) point to the etching byproduct, such as ammonium salt.

In one embodiment, the sublimation process may utilize a low RF bias power plasma treatment process to gently and mildly treat the substrate without damaging to the substrate surface. In one embodiment, the low temperature plasma process may use a low RF bias power, such as less than about 30 Watts, along with controlling the substrate temperature controlled between about 20 degrees Celsius and about 150 degrees Celsius, such as about 110 degrees Celsius, to sublimate the etching byproducts from the substrate surface.

The sublimation process is performed by supplying a sublimation gas mixture into the chamber 200. A plasma is then formed from the plasma in the sublimation gas mixture to plasma anneal the substrate 701, forming volatile gas byproducts which readily pumps out of the processing chamber 200.

In one embodiment, the sublimation gas mixture includes at least one of a hydrogen containing gas, a nitrogen containing gas, or an inert gas. It is believed that the hydrogen containing gas, the nitrogen containing gas, or inert gas supplied in the plasma anneal gas mixture may assist increasing the lifetime of the ions in the plasma formed from the sublimation gas mixture, thereby efficiently removing the etching byproducts from the substrate 701. Increased lifetime of the ions may assist reacting with and activating the etching byproduct on the substrate 701 more thoroughly, thereby enhancing the removal of the etching byproduct from the substrate 701.

During the sublimation process, several process parameters may be regulated to control the sublimation process. A RF bias power at a frequency of about 13 MHz may be applied to maintain a plasma in the treatment gas mixture. For example, a RF bias power of less than 30 Watts may be applied to maintain a plasma inside the processing chamber 200. The sublimation process mixture may be flowed into the chamber at a rate of between about 100 sccm to about 2000 sccm, such as about 1000 sccm. A substrate temperature is maintained between about 20 degrees Celsius and about 150 degrees Celsius, such as about 110 degrees Celsius. In some embodiment, no power is applied to the electrodes 243, 245.

It is noted that the three steps of the barrier layer etching process performed at block 606 may be repeatedly (i.e., cyclically) performed, until the barrier layer 710 is removed to expose the underlying low-k insulating dielectric material 712. The repeated processes may cyclically and incrementally etch the barrier layer 710 without over aggressively attacking the underlying substrate, thereby providing a good interface etching control and a proper etch stop endpoint. Incremental etching with repetitive treatment, etching process and sublimation process improves feature verticality and promotes etching selectivity among the barrier layer 710 without damaging corners or profile of the metal layer 708, thereby enhancing accuracy of mask to transfer feature critical dimensions (CD) to the barrier layer 710.

It is noted that after the barrier layer etching process, the hardmask layer 705 may be consumed or used up. In the embodiment where there are still some portion of the hardmask layer 705 remained on the substrate surface, an extra step of hardmask layer removal process may be performed to remove the hardmask layer 705 from the substrate as needed.

Optionally, after the barrier etching process at block 606, an optional cleaning process, similar to the cleaning process depicted at block 605 may be performed to clean the etched barrier layer surface and the metal layer surface prior to perform the subsequent processes as needed. It is noted that the optional cleaning process may also be performed in the processing system, such as the processing system 500 depicted in FIG. 5, where the metal layer etching process and the barrier layer etching process are performed.

At block 608, after the barrier layer etching process, a surface treatment process may be performed to move contaminants that may potentially remain on the metal layer 708. The surface treatment process may be a plasma treatment process to remove contaminants or metal oxide that may be generated during the etching process, including the metal layer etching process and the barrier layer etching process. The surface treatment process includes supplying a treatment gas mixture into a processing chamber. The surface treatment process may be performed in the same chamber where the barrier etching process is performed. Alternatively, the surface treatment process may be performed in a chamber where the next process will be performed, such as the selective metal deposition process or a liner layer deposition process, which will be described later at block 610, 612.

A surface treatment plasma is formed from the treatment gas mixture to plasma treat the substrate 701 to remove undesired metal oxide and contaminants, if any. In one embodiment, the treatment gas mixture includes at least one of an inert gas, a hydrogen containing gas and a nitrogen containing gas. In one embodiment, the inert gas utilized to perform the treatment process may be Ar gas, He gas, Kr or the like. In embodiment wherein a hydrogen containing gas is utilized, the hydrogen containing gas may include at least one of $H_2$, $H_2O$, $NH_3$ and the like. In embodiment wherein a nitrogen containing gas is utilized, the nitrogen containing gas may include at least one of $N_2$, $N_2O$, $NO_2$, $NH_3$ and the like. In an exemplary embodiment, the gas mixture utilized to perform the surface treatment process includes $H_2$ and $NH_3$ gas.

Figure 7E:
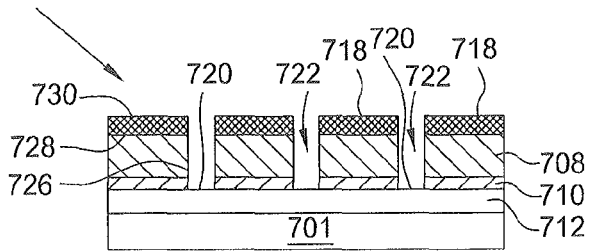

At block 610, after the substrate surface is treated and cleaned, a selective metal deposition process is performed to deposit a metal capping layer 718 on an upper surface 728 of the metal layer 708, as shown in FIG. 7E. The metal capping layer 718 may seal the exposed surface 728 of the metal layer 708 to reduce likelihood of the metal layer 708 being oxidized or contaminated once it is exposed. The metal layer 708 is selected to be fabricated from a material having a relatively good oxidation resistance (i.e., as compared to the material of the metal layer 708) and good metal conductivity to maintain a desired range of contact resistivity. In one embodiment, the metal capping layer 718 can be cobalt, tungsten, nickel, aluminum, ruthenium, or manganese-containing layer. It is noted that the metal capping layer 718 may only be selectively formed on the upper surface 728 of the metal layer 708.

In one embodiment, the metal capping layer 718 is a Co layer with a thickness between about 5 Å and about 75 Å.

It is noted that the metal capping layer 718 may both be formed in a PVD chamber, such as the chamber 300 depicted in FIG. 3 incorporated in the system 500 without breaking vacuum and atmosphere exposure. It is noted that the metal etching process, the barrier etching process, and the metal capping layer deposition process may be formed in one or more different processing chambers, such of the processing chambers 100, 200, 300 respectively, all of which are integrated incorporated in a single vacuum processing system, such as a cluster system, for example, the multi-chamber processing system 500 depicted in FIG. 5, so as to consecutively perform the processes without breaking vacuum and exposing the substrate 701 to an ambient atmosphere.

Figure 7F:
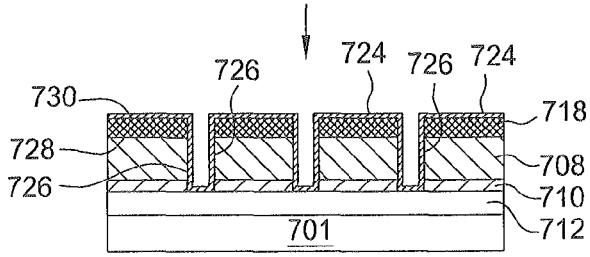

At block 612, after the metal capping layer 718 is formed on the substrate, a liner deposition process is then performed to form a liner layer 724 covering the surface of the substrate 701, including the upper surface 730 of the metal capping layer 718 and the sidewalls 726 of the metal capping layer 718 and the metal layer 708, as shown in FIG. 7F. The liner layer 724 formed on the substrate 701 may be formed in a CVD chamber, particular in a flowable CVD chamber, such as the processing chamber 400 depicted in FIG. 4 incorporated into the processing chamber 500 depicted in FIG. 5. It is noted that the liner layer 724 may be formed in the flowable CVD chamber, along with the metal etching process, barrier etching process, and the metal capping layer process, without breaking vacuum and atmosphere exposure. It is noted that the metal etching process, the barrier etching process, the metal capping layer deposition process and the liner deposition process may be formed in one or more different processing chambers, such of the processing chambers 100, 200, 300, 400 respectively, all of which are integrated incorporated in a single vacuum processing system, such as a cluster system, for example, the multi-chamber processing system 500 depicted in FIG. 5, so as to consecutively perform the processes without breaking vacuum and exposing the substrate 701 to an ambient atmosphere.

The liner layer 724, as formed on the substrate 701, may be a dielectric layer with low dielectric constant, such as low dielectric constant less than 4.0 (e.g., a low-k material). The liner layer 724 may be selected from a material that may assist bridging the metal capping layer 718 and a subsequent bulk dielectric insulting layer (later to be filled within the metal layer 708) with good interface properties. The liner layer 724 may assist interface adhesion between the metal capping layer 718 and subsequent bulk dielectric insulting layer without undesired crack or peeling.

The liner layer 724 may be formed as a thin layer so as to maintain good interconnection integrity without altering the conductivity, resistivity and capacitance of the overall interconnection structures. In one embodiment, the liner layer 724 is a dielectric layer with low dielectric constant, such as low dielectric constant less than 4.0 (e.g., a low-k material), so as to maintain good contact resistivity to the metal capping layer 718 and the metal layer 708. In one embodiment, the liner layer 724 may be a dielectric material, such as an oxygen free silicon carbon containing material, for example, SiCN, SiN, AlN, SiC, AlCN or the like. Alternatively, the liner layer 724 may be any suitable organic dielectric materials, polymer materials, such as polyamides, SOG, or the like. In one embodiment, the liner layer 724 may be a SiCN or SiC layer with a thickness between about 5 Å and about 50 Å.

The liner layer 724 may be formed as a thin layer so as to maintain good interconnection integrity without altering the conductivity, resistivity and capacitance of the overall interconnection structures. In one embodiment, the liner layer 724 is a dielectric layer with low dielectric constant, such as low dielectric constant less than 4.0 (e.g., a low-k material), so as to maintain good contact resistivity to the metal capping layer 716 and the metal layer 708. In one embodiment, the liner layer 724 may be a dielectric material, such as an oxygen free silicon carbon containing material, for example, SiCN, SiN, AlN, SiC, AlCN or the like. Alternatively, the liner layer 724 may be any suitable organic dielectric materials, polymer materials, such as polyamides, SOG, or the like. In one embodiment, the liner layer 724 may be a SiCN or SiC layer with a thickness between about 5 Å and about 50 Å.

In one embodiment, the gas mixture supplied into the deposition chamber 400 for forming the liner layer 718 may include a dielectric material precursor and a processing precursor. Suitable examples of the dielectric material precursor include silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$, containing precursors, such as sillyl-amine and its derivatives including trisillylamine (TSA) and disillylamine (DSA), $Si_xN_yH_zO_{zz}$ containing precursors, $Si_xN_yH_zCl_{zz}$ containing precursors, or combinations thereof. In one exemplary embodiment, the silicon containing precursor used for depositing the liner layer 718 is trisillylamine (TSA).

In addition, suitable examples of the processing precursors may include a nitrogen containing precursor. Suitable examples of the nitrogen containing precursor includes a $H_2/N_2$ mixture, $N_2$, $NH_3$, $NH_4OH$, $N_2$, $N_xH_y$ compounds including $N_2H_4$ vapor, NO, $N_2O$, $NO_2$ and the like. Furthermore, the processing precursors may also include hydrogen-containing compounds, oxygen-containing compounds or combinations thereof. Examples of suitable processing precursors include one or more of compounds selected from the group comprising of $H_2$, a $H_2/N_2$ mixture, $O_3$, $O_2$, $H_2O_2$, $CO_2$ water vapor, or combinations thereof. The processing precursors may be plasma excited, such as in the RPS unit, to include N* and/or H* and/or O* containing radicals or plasma, for example, $NH_3$, $NH_2$*, NH*, N*, H*, O*, N*O*, or combinations thereof. The processing precursor may alternatively, include one or more of the precursors as needed. In one embodiment, the processing precursor used for depositing the liner layer 718 is $NH_3$ and $CO_2$ gas. One or more inert gases may also be included with the gas mixture provided to the deposition chamber 400. The inert gas may include, but not limited to, noble gas, such as Ar, He, Xe, and the like.

Figure 8A:
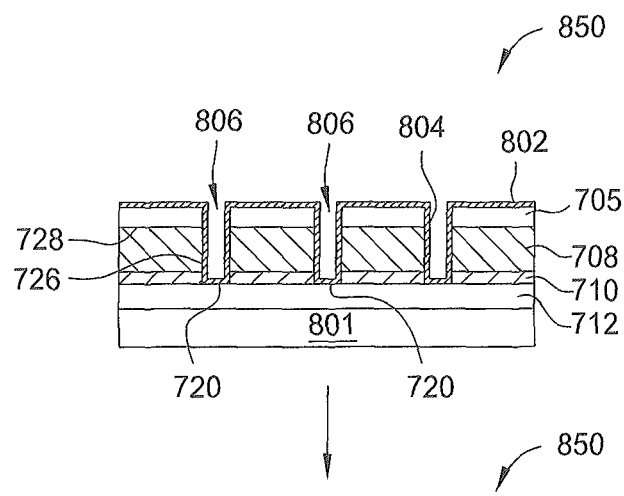
FIGS. 8A-8C depict another embodiment of a sequence for forming the interconnection structure on a substrate in accordance with the embodiment depicted in FIG. 5.
Figure 8B:
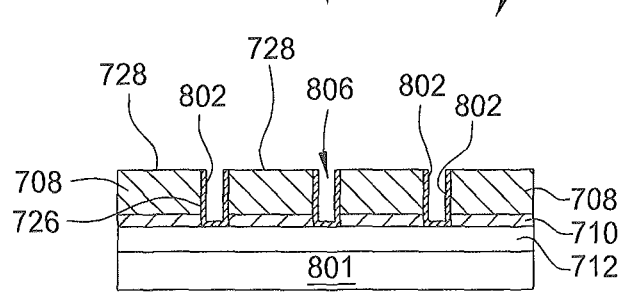
Figure 8C:
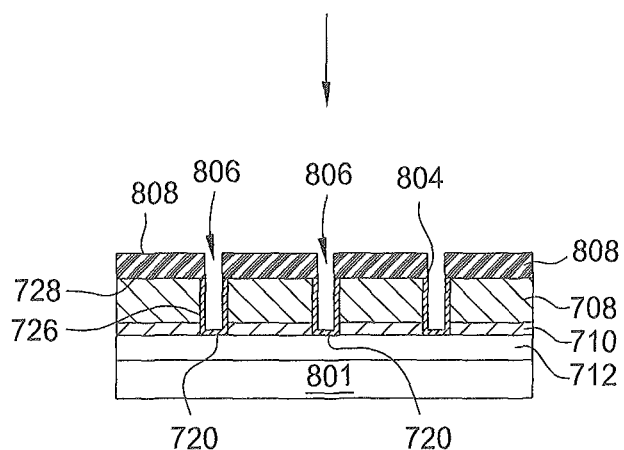

In an alternate embodiment, the order of performing the selective metal deposition process at block 610 and the liner deposition process at block 612 may be performed in a reversed order, as indicated by the arrow 614, with referenced to FIGS. 8A-8C. Similar to the description above, after the surface treatment process at block 608, a liner deposition process at block 612 may be performed to form a liner layer 802 on the substrate 807 covering both the hardmask layer 705, if any, and the sidewalls 726 of the metal layer 708, as shown in FIG. 8A. Subsequently, additional steps, including a CMP process or an etching process may be performed to remove the liner layer 802 from the upper surface 728 of the metal layer 708, only leaving the liner layer 802 on the sidewalls 726 of the metal layer 708. Subsequently, the selective metal deposition process at block 610 may be then performed to selectively form a metal capping layer 808 on the surface 728 of the metal layer 708, as shown in FIG. 8C. Similarly, all these process steps, when manufacturing the interconnection structures of 8A-8C, may also be manufactured in the processing system 500 depicted in FIG. 5 without breaking vacuum and exposing the substrate 801 to an ambient atmosphere.

Thus, methods for forming an interconnection of semiconductor devices are provided. The integration of the metal etching process, barrier layer etching process, selective metal deposition process and liner layer deposition forming in a single plasma system may efficiently protect the metal line from exposure to the atmosphere, thereby eliminating likelihood of native oxide formation or contamination, maintaining a good interface control. By utilizing a proper integration sequence of forming interconnection structure, the metal line may be controlled with minimum oxide or contamination generation, thereby increasing manufacturing flexibility without degradation of device performance.

While the foregoing is directed to embodiments of the present invention, other and further embodiments of the invention may be devised without departing from the basic scope thereof, and the scope thereof is determined by the claims that follow.

The invention claimed is:
1. A method for forming an interconnection structure for semiconductor devices, comprising:

supplying a barrier layer etching gas mixture into a first processing chamber having a substrate disposed therein to etch portions of a barrier layer exposed by a patterned metal layer until the underlying substrate is exposed in the first processing chamber disposed in a processing system; and subsequently forming a liner layer on the substrate covering the etched barrier layer in a second processing chamber disposed in the processing system, wherein the liner layer is an oxygen free silicon carbon containing material.

2. The method of claim 1, further comprising:

forming a metal capping layer on a surface of the metal layer in a third processing chamber disposed in the plasma system.

3. The method of claim 1, wherein the barrier layer is fabricated from a material selected from a group consisting of metal silicide, TaN, TiN, AlN, TaSiN, TiSiN, AlO, AlON, MnN, CoWP, NiW, W, refractory metal nitrides, or AlN.

4. The method of claim 1, wherein supplying a barrier layer etching gas mixture to the first processing chamber disposed in the processing system to etch portions of the barrier layer further comprises:

performing a treatment process on the barrier layer by supplying a treatment gas in the second processing chamber;

performing an etching process using a remote plasma source formed from a gas mixture including $NF_3$ and $NH_3$.

5. The method of claim 4, further comprising:

performing a sublimation process on the substrate.

6. The method of claim 1, wherein supplying a barrier layer etching gas mixture to the first processing chamber disposed in the processing system to etch portions of the barrier layer further comprises:

performing a surface treatment process by supplying a gas mixture including $NH_3$ and $H_2$ after the barrier layer etching process but prior to forming the liner layer.

7. The method of claim 2, wherein the metal capping layer is formed on the metal layer prior to forming the liner layer.

8. The method of claim 2, further comprising:

removing portions of the liner layer from an upper surface of the metal layer to allow the metal capping layer to selectively form on the upper surface of the metal layer.

9. The method of claim 1, wherein the barrier layer is formed between the metal layer and the substrate.

10. The method of claim 1, wherein the liner layer is formed from a flowable CVD process using trisillylamine (TSA) as a precursor.

11. The method of claim 2, wherein the metal capping layer is fabricated from a material selected from a group consisting of cobalt, tungsten, nickel, aluminum, ruthenium, and manganese-containing layer.

12. The method of claim 1, wherein the metal layer includes copper.

13. The method of claim 4, wherein the treatment gas includes He gas.

14. The method of claim 6, further comprising:

performing a cleaning process on the substrate after the barrier layer etching but prior to the surface treatment process.

15. A method for forming an interconnection structure for semiconductor devices, comprising:

performing a metal etching process on a substrate in a first processing chamber disposed in a processing system to etch a metal layer disposed on a substrate, wherein the substrate has the metal layer disposed on a barrier layer, a patterned hardmask layer disposed on the metal layer exposing portions of the metal layer for etching;

performing a barrier layer etching process in a second processing chamber disposed in the processing system to etch the barrier layer exposed by the metal layer after the metal etching process; and subsequently performing a liner layer deposition process in a third processing chamber disposed in the plasma processing chamber on the substrate to form a liner layer on the substrate, wherein the liner layer is an oxygen free silicon carbon containing material.

16. The method of claim 15, further comprising:

performing a metal capping layer deposition process to form a metal capping layer on the metal layer prior to forming the liner layer.

17. The method of claim 15, further comprising:

removing a portion of the liner layer form an upper surface of the metal layer; and selectively forming the metal capping layer on the upper surface of the metal layer.

18. The method of claim 16, wherein the metal capping layer is formed in the plasma processing chamber.

19. A method for forming an interconnection structure for semiconductor devices, comprising:

performing a metal etching process on a substrate to etch a metal layer disposed on a substrate, wherein the substrate has the metal layer disposed on a barrier layer, a patterned hardmask layer disposed on the metal layer exposing portions of the metal layer for etching;

performing a barrier layer etching process to etch the barrier layer exposed by the metal layer after the metal etching process; and subsequently performing a liner layer deposition process on the substrate to form a liner layer on the substrate, wherein the barrier layer etching process and the liner layer deposition process are formed in a processing system without breaking vacuum, wherein the liner layer is an oxygen free silicon carbon containing material.

20. The method of claim 19, further comprising:

performing a metal capping layer process to selectively form a metal capping layer on the metal layer in the plasma processing chamber without breaking vacuum.

* * * * *

UNITED STATES PATENT AND TRADEMARK OFFICE
CERTIFICATE OF CORRECTION

PATENT NO. : 9,508,561 B2
APPLICATION NO. : 14/276879
DATED : November 29, 2016
INVENTOR(S) : Mehul B. Naik et al.

It is certified that error appears in the above-identified patent and that said Letters Patent is hereby corrected as shown below:

On the Title Page

In Item (54), in Column 1, in "Title", Line 4, delete "SEMICONDCUTOR" and insert -- SEMICONDUCTOR --, therefor.

In the Specification

In Column 1, Line 4, delete "SEMICONDCUTOR" and insert -- SEMICONDUCTOR --, therefor.

In Column 8, Line 65, delete "blacker" and insert -- blocker --, therefor.

In Column 12, Line 62, after "also" insert -- be --.

In Column 14, Line 19, delete "infrared" and insert -- infra-red --, therefor.

In Column 16, Line 43, delete "sillyl-" and insert -- silyl- --, therefor.

In Column 16, Line 44, delete "trisillylamine" and insert -- trisilylamine --, therefor.

In Column 16, Line 44, delete "disillylamine" and insert -- disilylamine --, therefor.

In Column 21, Line 33, delete "$CH_xCu_yH_z$," and insert -- $CH_xCu_yH_z$ --, therefor.

In Column 27, Line 64, delete "sillyl-" and insert -- silyl- --, therefor.

In Column 27, Line 65, delete "trisillylamine" and insert -- trisilylamine --, therefor.

In Column 27, Line 65, delete "disillylamine" and insert -- disilylamine --, therefor.

Signed and Sealed this
Eighteenth Day of April, 2017

Michelle K. Lee
*Director of the United States Patent and Trademark Office*

CERTIFICATE OF CORRECTION (continued)
U.S. Pat. No. 9,508,561 B2

In Column 28, Line 2, delete "trisillylamine" and insert -- trisilylamine --, therefor.

In the Claims

In Column 29, Line 49, in Claim 10, delete "trisillylamine" and insert -- trisilylamine --, therefor.